(12) United States Patent
Yu et al.

(10) Patent No.: US 10,367,522 B2
(45) Date of Patent: Jul. 30, 2019

(54) HIGH EFFICIENCY POWER AMPLIFIER ARCHITECTURES FOR RF APPLICATIONS

(71) Applicant: MY Tech, LLC, Irvine, CA (US)

(72) Inventors: Tommy Yu, Orange, CA (US); Avanindra Madisetti, Coto de Caza, CA (US)

(73) Assignee: MY Tech, LLC, Irvine, CA (US)

( * ) Notice: Subject to any disclaimer, the term of this patent is extended or adjusted under 35 U.S.C. 154(b) by 0 days.

(21) Appl. No.: 15/819,475

(22) Filed: Nov. 21, 2017

(65) Prior Publication Data

US 2018/0145700 A1    May 24, 2018

Related U.S. Application Data

(60) Provisional application No. 62/427,641, filed on Nov. 29, 2016, provisional application No. 62/425,035, filed on Nov. 21, 2016.

(51) Int. Cl.
*H03F 3/38* (2006.01)
*H03M 3/00* (2006.01)
*H03F 3/19* (2006.01)
*H03F 3/217* (2006.01)
*H03M 7/32* (2006.01)
(Continued)

(52) U.S. Cl.
CPC ............ *H03M 3/39* (2013.01); *H03F 1/0227* (2013.01); *H03F 3/19* (2013.01); *H03F 3/2171* (2013.01); *H03F 3/245* (2013.01); *H03M 7/3004* (2013.01); *H03F 3/2175* (2013.01); *H03F 2200/102* (2013.01); *H03F 2200/171* (2013.01); *H03F 2200/451* (2013.01)

(58) Field of Classification Search
CPC .................................. H03F 3/38; H03F 3/217
USPC ..................................... 330/10; 375/247, 248
See application file for complete search history.

(56) References Cited

U.S. PATENT DOCUMENTS

| 5,682,161 A | 10/1997 | Ribner et al. |
| 6,724,249 B1 | 4/2004 | Nilsson |
| 7,176,820 B1 | 2/2007 | Fuller et al. |

(Continued)

FOREIGN PATENT DOCUMENTS

| WO | 2016063038 A1 | 4/2016 |
| WO | 2018094380 A1 | 5/2018 |

OTHER PUBLICATIONS

International Search Report and Written Opinion for International Application No. PCT/US2017/062744, Search completed Jan. 17, 2018, dated Feb. 5, 2018, 13 Pgs.
(Continued)

*Primary Examiner* — Steven J Mottola
(74) *Attorney, Agent, or Firm* — KPPB LLP

(57) ABSTRACT

A parallel delta sigma modulator architecture is disclosed. The parallel delta sigma modulator architecture includes a signal demultiplexer configured to receive an input signal and to demultiplex the input signal to output a plurality of streams, a plurality of delta sigma modulators executing in parallel, each delta sigma modulator configured to receive a stream from the plurality of streams and to generate a delta sigma modulated output, and a signal multiplexer configured to receive a plurality of delta sigma modulated outputs from the plurality of delta sigma modulators and to multiplex together the plurality of delta sigma modulated outputs into a pulse train.

26 Claims, 16 Drawing Sheets

(51) Int. Cl.
*H03F 1/02* (2006.01)
*H03F 3/24* (2006.01)

(56) References Cited

U.S. PATENT DOCUMENTS

| | | | |
|---|---|---|---|
| 8,294,605 B1* | 10/2012 | Pagnanelli | H03M 3/358 |
| | | | 341/144 |
| 8,949,699 B1 | 2/2015 | Gustlin | |
| 10,020,818 B1 | 7/2018 | Yu et al. | |
| 2001/0022555 A1 | 9/2001 | Lee et al. | |
| 2002/0053986 A1 | 5/2002 | Brooks et al. | |
| 2002/0057214 A1 | 5/2002 | Brooks et al. | |
| 2002/0061086 A1 | 5/2002 | Adachi et al. | |
| 2002/0093442 A1 | 7/2002 | Gupta et al. | |
| 2003/0128143 A1 | 7/2003 | Yap et al. | |
| 2003/0137359 A1 | 7/2003 | Patana et al. | |
| 2003/0174080 A1 | 9/2003 | Brooks et al. | |
| 2003/0179121 A1 | 9/2003 | Gupta et al. | |
| 2003/0227401 A1 | 12/2003 | Yang et al. | |
| 2004/0032355 A1 | 2/2004 | Melanson et al. | |
| 2004/0066321 A1 | 4/2004 | Brooks et al. | |
| 2004/0081266 A1 | 4/2004 | Adachi et al. | |
| 2004/0108947 A1 | 6/2004 | Yang et al. | |
| 2004/0228416 A1 | 11/2004 | Anderson et al. | |
| 2004/0233084 A1 | 11/2004 | Brooks et al. | |
| 2004/0233085 A1 | 11/2004 | Fukuda et al. | |
| 2004/0252038 A1 | 12/2004 | Robinson et al. | |
| 2005/0001750 A1 | 1/2005 | Lo et al. | |
| 2005/0012649 A1 | 1/2005 | Adams et al. | |
| 2005/0030212 A1 | 2/2005 | Brooks et al. | |
| 2005/0057385 A1 | 3/2005 | Gupta et al. | |
| 2005/0062627 A1 | 3/2005 | Jelonnek et al. | |
| 2005/0063505 A1 | 3/2005 | Dubash et al. | |
| 2005/0088327 A1 | 4/2005 | Yokoyama et al. | |
| 2005/0093726 A1 | 5/2005 | Hezar et al. | |
| 2005/0116850 A1 | 6/2005 | Hezar et al. | |
| 2005/0128111 A1 | 6/2005 | Brooks et al. | |
| 2005/0156767 A1 | 7/2005 | Melanson et al. | |
| 2005/0156768 A1 | 7/2005 | Melanson et al. | |
| 2005/0156771 A1 | 7/2005 | Melanson et al. | |
| 2005/0162222 A1 | 7/2005 | Hezar et al. | |
| 2005/0207480 A1 | 9/2005 | Norsworthy et al. | |
| 2005/0266805 A1 | 12/2005 | Jensen et al. | |
| 2005/0285685 A1 | 12/2005 | Frey et al. | |
| 2006/0028364 A1 | 2/2006 | Rivoir et al. | |
| 2006/0038708 A1 | 2/2006 | Luh et al. | |
| 2006/0044057 A1 | 3/2006 | Hezar et al. | |
| 2006/0109153 A1 | 5/2006 | Gupta et al. | |
| 2006/0115036 A1 | 6/2006 | Adachi et al. | |
| 2006/0164276 A1 | 7/2006 | Luh et al. | |
| 2006/0290549 A1 | 12/2006 | Laroia et al. | |
| 2007/0001776 A1 | 1/2007 | Li et al. | |
| 2007/0013566 A1 | 1/2007 | Chuang et al. | |
| 2007/0018866 A1 | 1/2007 | Melanson et al. | |
| 2007/0035425 A1 | 2/2007 | Hinrichs et al. | |
| 2007/0080843 A1 | 4/2007 | Lee et al. | |
| 2007/0126618 A1 | 6/2007 | Tanaka et al. | |
| 2007/0152865 A1 | 7/2007 | Melanson et al. | |
| 2007/0165708 A1 | 7/2007 | Darabi et al. | |
| 2007/0279034 A1 | 12/2007 | Roh et al. | |
| 2008/0062022 A1 | 3/2008 | Melanson et al. | |
| 2008/0062024 A1 | 3/2008 | Maeda et al. | |
| 2008/0100486 A1 | 5/2008 | Lin et al. | |
| 2008/0180166 A1 | 7/2008 | Gustat et al. | |
| 2008/0191713 A1 | 8/2008 | Hauer et al. | |
| 2008/0198050 A1 | 8/2008 | Akizuki et al. | |
| 2008/0211588 A1 | 9/2008 | Frey et al. | |
| 2008/0272945 A1 | 11/2008 | Melanson et al. | |
| 2008/0272946 A1 | 11/2008 | Melanson et al. | |
| 2009/0083567 A1 | 3/2009 | Kim et al. | |
| 2009/0096649 A1 | 4/2009 | Ferri et al. | |
| 2009/0220219 A1 | 9/2009 | McLeod et al. | |
| 2009/0309774 A1 | 12/2009 | Hamashita et al. | |
| 2010/0045498 A1 | 2/2010 | Liu et al. | |
| 2010/0052960 A1 | 3/2010 | Lakdawala et al. | |
| 2010/0074368 A1 | 3/2010 | Karthaus et al. | |
| 2010/0164773 A1 | 7/2010 | Clement et al. | |
| 2010/0214143 A1 | 8/2010 | Nakamoto et al. | |
| 2010/0219999 A1 | 9/2010 | Oliaei et al. | |
| 2010/0225517 A1 | 9/2010 | Aiba et al. | |
| 2010/0283648 A1 | 11/2010 | Niwa et al. | |
| 2010/0295715 A1 | 11/2010 | Sornin et al. | |
| 2011/0006936 A1 | 1/2011 | Lin et al. | |
| 2011/0050472 A1 | 3/2011 | Melanson et al. | |
| 2011/0149155 A1 | 6/2011 | Lin et al. | |
| 2011/0299642 A1 | 12/2011 | Norsworthy et al. | |
| 2012/0063519 A1 | 3/2012 | Oliaei et al. | |
| 2012/0161864 A1* | 6/2012 | Lee | H03F 3/217 |
| | | | 330/10 |
| 2012/0194369 A1 | 8/2012 | Galton et al. | |
| 2012/0200437 A1 | 8/2012 | Moue et al. | |
| 2012/0242521 A1 | 9/2012 | Kinyua et al. | |
| 2012/0275493 A1 | 11/2012 | Fortier et al. | |
| 2012/0280843 A1 | 11/2012 | Tsai et al. | |
| 2012/0286982 A1 | 11/2012 | Kajita et al. | |
| 2013/0068019 A1 | 3/2013 | Takase et al. | |
| 2013/0099949 A1 | 4/2013 | Wagner et al. | |
| 2013/0169460 A1 | 7/2013 | Obata et al. | |
| 2013/0259103 A1 | 10/2013 | Jensen et al. | |
| 2014/0028374 A1 | 1/2014 | Zare-Hoseini et al. | |
| 2014/0035769 A1 | 2/2014 | Rajaee et al. | |
| 2014/0070969 A1 | 3/2014 | Shu | |
| 2014/0113575 A1 | 4/2014 | Mitani et al. | |
| 2014/0286467 A1 | 9/2014 | Norsworthy et al. | |
| 2014/0307825 A1 | 10/2014 | Ostrovskyy et al. | |
| 2014/0320325 A1 | 10/2014 | Muthers et al. | |
| 2014/0368365 A1 | 12/2014 | Quiquempoix et al. | |
| 2015/0002325 A1 | 1/2015 | Lin | |
| 2015/0009054 A1 | 1/2015 | Ono et al. | |
| 2015/0036766 A1 | 2/2015 | Elsayed et al. | |
| 2015/0061907 A1 | 3/2015 | Miglani | |
| 2015/0084797 A1 | 3/2015 | Singh et al. | |
| 2015/0109157 A1 | 4/2015 | Caldwell et al. | |
| 2015/0116138 A1 | 4/2015 | Li et al. | |
| 2015/0146773 A1 | 5/2015 | Ma et al. | |
| 2015/0171887 A1 | 6/2015 | Okuda | |
| 2015/0341159 A1 | 11/2015 | Norsworthy et al. | |
| 2015/0349794 A1 | 12/2015 | Line | |
| 2016/0013805 A1 | 1/2016 | Maehata | |
| 2016/0049947 A1 | 2/2016 | Adachi | |
| 2016/0050382 A1 | 2/2016 | Rizk et al. | |
| 2016/0065236 A1 | 3/2016 | Ahmed et al. | |
| 2016/0149586 A1 | 5/2016 | Roh et al. | |
| 2016/0336946 A1 | 11/2016 | Ho et al. | |
| 2016/0344404 A1 | 11/2016 | Miglani et al. | |
| 2016/0359499 A1 | 12/2016 | Bandyopadhyay | |
| 2016/0373125 A1 | 12/2016 | Pagnanelli et al. | |
| 2017/0033801 A1 | 2/2017 | Lo et al. | |
| 2017/0041019 A1 | 2/2017 | Miglani et al. | |
| 2017/0045403 A1 | 2/2017 | Zanbaghi et al. | |
| 2017/0093407 A1 | 3/2017 | Kim et al. | |
| 2017/0102248 A1 | 4/2017 | Maurer et al. | |
| 2017/0134055 A1 | 5/2017 | Ebrahimi et al. | |
| 2017/0163295 A1 | 6/2017 | Talty et al. | |
| 2017/0170839 A1 | 6/2017 | Zhao et al. | |
| 2017/0170840 A1 | 6/2017 | Zhao | |
| 2017/0184645 A1 | 6/2017 | Sawataishi | |
| 2017/0222652 A1 | 8/2017 | Adachi | |
| 2017/0222658 A1 | 8/2017 | Miglani et al. | |
| 2017/0250662 A1 | 8/2017 | Cope et al. | |
| 2017/0276484 A1 | 9/2017 | Marx et al. | |
| 2017/0288693 A1 | 10/2017 | Kumar et al. | |

OTHER PUBLICATIONS

Aigner et al., "Advancement of MEMS into RF-Filter Applications", International Electron Devices Meetings, IEDM '02, Dec. 8-11, 2002, pp. 897-900.

Lam, "A Review of the Recent Development of MEMS and Crystal Oscillators and Their Impacts on the Frequency Control Products Industry", Invited Paper, 2008 IEEE International Ultrasonics Symposium, Beijing, Nov. 2-5, 2008, 11 pages.

(56) References Cited

OTHER PUBLICATIONS

Piazza et al., "Piezoelectric Aluminum Nitride Vibrating Contour-Mode MEMS Resonators", Journal of Microelectromechanical Systems, Dec. 2006, vol. 15, No. 6, pp. 1406-1418.
International Preliminary Report on Patentability for International Application PCT/US2017/062744, Report issed May 21, 2019, dated May 31, 2019, 8 Pgs.

* cited by examiner

HIGH EFFICIENCY POWER AMPLIFIER ARCHITECTURES FOR RF APPLICATIONS

CROSS REFERENCED APPLICATIONS

This application claims priority under 35 U.S.C. 119(e) to U.S. Provisional Patent Application Ser. No. 62/425,035, entitled "Switch-mode Power Amplifier (PA) Architecture for RF Application", filed Nov. 21, 2016 and U.S. Provisional Patent Application Ser. No. 62/427,641, entitled "Switch-mode Power Amplifier (PA) Architecture for RF Application" filed Nov. 29, 2016, and that are hereby incorporated by reference in their entirety as if set forth herewith.

FIELD OF THE INVENTION

The present invention relates to delta sigma modulators and more specifically to parallel delta sigma modulator architectures for improved power conversion efficiency in power amplifiers.

BACKGROUND

A radio frequency power amplifier (RF power amplifier) is a type of electronic amplifier that converts a low-power radio-frequency signal into a higher power signal. There are many classes of power amplifiers which are used to distinguish the electrical characteristics and methods of operation of the power amplifiers. Accordingly, the classes of power amplifiers are mainly lumped into two basic groups. The first are the classically controlled conduction angle amplifiers forming the more common amplifier classes of A, B, AB and C, which are defined by the length of their conduction state over some portion of the output waveform, such that the output stage transistor operation lies somewhere between being "fully-ON" and "fully-OFF".

The second set of amplifiers are the newer so-called "switching" amplifier classes of D, E, F, G, S, T among others, which use digital circuits and pulse width modulation (PWM) to constantly switch the signal between "fully-ON" and "fully-OFF" driving the output hard into the transistors saturation and cut-off regions.

Different types of power amplifier architectures may include different types of components. For example, the type S power amplifiers convert analogue input signals into digital square wave pulses by a delta sigma modulator, and amplifies them to increases the output power before finally being filtered by a band pass filter.

In particular, delta sigma modulation is a method for encoding analog signals into digital signals as found in an analog to digital (ADC) converter. Delta sigma modulation may also be used to transfer high bit-count low frequency digital signals into lower bit-count higher frequency digital signals as found in digital to analog (DAC) operation. This technique is popular in modern electronic components such as converters, frequency synthesizers, switched-mode power supplies and motor controllers, due to its cost efficiency and reduced circuit complexity.

In addition, delta sigma modulators may reduce noise using noise shaping and increase signal resolution using filtering. In noise shaping, noise is filtered by a noise shaping filter. This means that the noise is reduced inside frequencies of interest and increased outside the frequencies of interest. As a result, the resolution of the signal is increased. In delta sigma modulators, noise shape filtering may be performed at an over-sampled rate. The noise shaping is achieved by subtracting estimated in-band noise from an input signal of the delta sigma modulator. The estimated in-band noise subtraction is done through the feed-back path in the modulator. A post noise shaping filter can be placed after the modulator that cuts the noise from outside the frequency of interest which, in turn increases the signal's resolution.

As such, delta sigma modulators can provide a less complex and cost efficient manner to perform Analog to Digital (A/D) and Digital to Analog (D/A) conversion in many electronic components including, but not limited to ADCs, DACs, frequency synthesizers, switch-mode power supplies, and motor controllers.

SUMMARY OF THE INVENTION

Systems and methods in accordance with embodiments of the invention use parallel delta sigma modulators for improved power conversion efficiency in power amplifiers. In accordance with one embodiment, a parallel delta sigma modulator includes a signal demultiplexer configured to receive an input signal and to demultiplex the input signal into several streams of symbols at symbol boundaries; several delta sigma modulators, where each delta sigma modulator is configured to receive a stream of symbols from the several streams of symbols and to generate a delta sigma modulated output; and a signal multiplexer configured to receive several delta sigma modulated outputs from the several delta sigma modulators and to multiplex together the several delta sigma modulated outputs into a pulse train.

In a further embodiment, the input signal is an orthogonal frequency—division multiplexing (OFDM) modulated signal.

In a further embodiment again, the OFDM signal includes several symbols and the signal demultiplexer demultiplexes the input signal using the several symbols and the signal multiplexer multiplexes the several delta sigma modulated outputs using the several symbols.

In another embodiment, the input signal is selected from the group consisting of a complex base-band signal, an RF signal, and a WiFi base-band signal.

In yet another embodiment, the delta sigma modulator includes a switch-mode power amplifier configured to receive the pulse train for signal amplification.

In still another embodiment, the delta sigma modulator includes a frequency up-converter configured to receive the pulse train.

In yet another embodiment again, a clock frequency of a delta sigma modulator in the several delta sigma modulators is an integer divider of the pulse train output frequency In a further embodiment, each delta sigma modulator in the several delta sigma modulators includes a noise shaping filter that is un-constrained.

In still a further embodiment again, each delta sigma modulator outputs a three level signal (−1, 0, 1) that drives a switch-mode power amplifier (PA), where a '1' means the switch-mode PA outputs a positive voltage pulse, a '−1' means the switch-mode PA outputs a negative voltage pulse, and a '0' means the PA is off.

In another embodiment again, an output of a delta sigma modulator in the several delta sigma modulators drives a linear amplifier, wherein the output is selected from the group consisting of a constant amplitude signal and a zero state signal, wherein the zero state signal turns off amplitude.

In a still further embodiment, an output of a delta sigma modulator in the several delta sigma modulators drives a switch-mode power amplifier (PA), wherein the output includes several discrete signal levels.

In another embodiment further, a delta sigma modulator design is un-constrained and the equivalent oversample ratio of the delta sigma modulator is increased by N, where N equals the number of parallel delta sigma modulators.

In one embodiment, a switch-mode power amplifier system includes: a signal encoder including a delta sigma modulator; a switch-mode power amplifier; a reconstruction filter; where the delta sigma modulator includes: a signal demultiplexer configured to receive an input signal and to demultiplex the input signal into a plurality of streams of symbols at symbol boundaries; a plurality of delta sigma modulators, where each delta sigma modulator is configured to receive a stream of symbols from the plurality of streams of symbols and to generate a delta sigma modulated output; and a signal multiplexer configured to receive a plurality of delta sigma modulated outputs from the plurality of delta sigma modulators and to multiplex together the plurality of delta sigma modulated outputs into a pulse train.

In a further embodiment, the input signal is an orthogonal frequency—division multiplexing (OFDM) modulated signal.

In a further embodiment still, the OFDM signal comprises a plurality of symbols; and the signal demultiplexer demultiplexes the input signal using the plurality of symbols and the signal multiplexer multiplexes the plurality of delta sigma modulated outputs using the plurality of symbols.

In still a further embodiment, the input signal is selected from the group consisting of a complex base-band signal, an RF signal, and a WiFi base-band signal.

In yet a further embodiment, the switch mode power amplifier system includes a frequency up-converter configured to receive the pulse train.

In another embodiment, a clock frequency of a delta sigma modulator in the plurality of delta sigma modulators is an integer divider of the pulse train output frequency.

In another embodiment, each delta sigma modulator in the several delta sigma modulators includes a noise shaping filter that is un-constrained.

In still another embodiment, each delta sigma modulator outputs a three level signal (−1, 0, 1) that drives the switch-mode power amplifier (PA), wherein a '1' means the switch-mode PA outputs a positive voltage pulse, a '−1' means the switch-mode PA outputs a negative voltage pulse, and a '0' means the PA is off.

In yet another further embodiment, an output of a delta sigma modulator in the several delta sigma modulators drives the switch-mode power amplifier (PA), wherein the output includes a plurality of discrete signal levels.

In still a further embodiment, a delta sigma modulator design is un-constrained and the equivalent oversample ratio of the delta sigma modulator is increased by N, where N equals the number of parallel delta sigma modulators.

In one embodiment, a linear power amplifier system includes: a signal encoder comprising a delta sigma modulator; a linear power amplifier (PA); a reconstruction filter; where the delta sigma modulator includes: a signal demultiplexer configured to receive an input signal and to demultiplex the input signal into several streams of symbols at symbol boundaries; several delta sigma modulators, where each delta sigma modulator is configured to receive a stream of symbols from the several streams of symbols and to generate a delta sigma modulated output; and a signal multiplexer configured to receive several delta sigma modulated outputs from the several delta sigma modulators and to multiplex together the several delta sigma modulated outputs into a pulse train; and where an output of a delta sigma modulator in the several delta sigma modulators drives the linear power amplifier (PA), wherein the output includes a plurality of discrete signal levels.

In a further embodiment, the input signal is an orthogonal frequency-division multiplexing (OFDM) modulated signal, where the OFDM signal includes a plurality of symbols; and the signal demultiplexer demultiplexes the input signal using the several symbols and the signal multiplexer multiplexes the several delta sigma modulated outputs using the several symbols.

DETAILED DESCRIPTION

Turning now to the drawings, power amplifier (PA) systems and methods for achieving high efficiency in PA architectures for RF applications in accordance with various embodiments of the invention are illustrated.

One of the most important parameters of an amplifier is its power conversion efficiency. Power conversion efficiency is a measure of how effectively an amplifier converts power drawn from a DC supply to useful signal (e.g., an RF signal) power delivered to a load. Power that is not converted to useful signal power is typically dissipated as heat; and for power amplifiers that have a low efficiency, the thermal and mechanical requirements resulting from high levels of heat dissipation are often limiting factors in their design.

As such, power amplifiers may be categorized according to the following two groups as related to their power conversion efficiency (in additional to the classes of amplifiers described above): 1) linear amplifiers, and 2) non-linear amplifiers. Linear amplifiers, as the name implies, maintain good signal linearity at the amplifier output. However, a linear amplifier typically has a lower power conversion efficiency compared to a non-linear amplifier. A non-linear amplifier can achieve high power conversion efficiency at the expense of signal linearity degradation. It is traditionally used in communication systems that transmit signals with a constant amplitude envelope such as systems that employ frequency modulation (FM). In modern communication systems that use wider bandwidth and more bandwidth efficient modulation, linearity performance is important so linear amplifiers are almost always used. On the other hand, bandwidth efficient modulation translates to higher peak to average power ratio (PAPR) for the signal. Linear PA power conversion efficiency typically degrades with the increase of signal PAPR. For example, class A PA power conversion efficiency can be estimated as $10^{(-PAPR/10)}$ assuming ideal circuitry for the rest of the system. For a sinusoid signal that swings between the voltage rails, the efficiency is typically 50% (PAPR is 3 dB). For a typical LTE or WiFi signal, the PAPR can be between 8 to 10 dB. At 10 dB PAPR, the power conversion efficiency is 10%. To output 250 mW of RF power, the PA consumes 2.5 W where 2.25 W or 90% are dissipated as heat.

Figure 1:
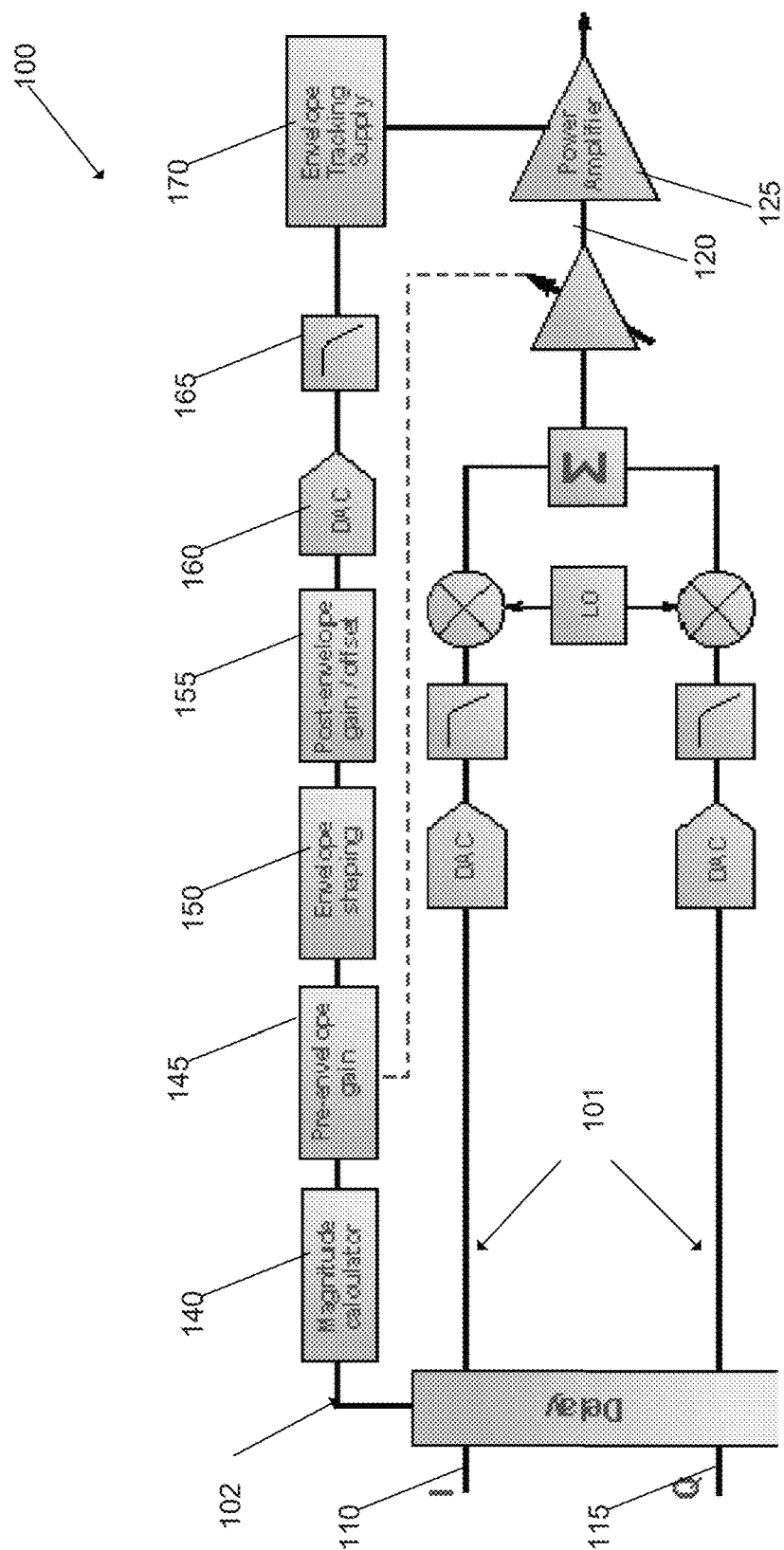
FIG. 1 illustrates an example architecture of an envelope tracking power amplifier system.

Several power amplifier architectures have been proposed to improve power conversion efficiency. One example is an envelope tracking power amplifier. Envelope tracking describes an approach to RF amplifier design in which the power supply voltage applied to the RF power amplifier is continuously adjusted to increase the proportion of time at which the amplifier is operating at peak efficiency with respect to the power required at each instant of transmission. An example architecture of an envelope tracking power amplifier system is illustrated in FIG. 1. One skilled in the art will appreciate that the power amplifier system 100 may be embodied in hardware components, or a combination of hardware and firmware and/or software components. Furthermore, one skilled in the art will appreciate that the power amplifier system 100 is only a representation of an envelope tracking power amplifier system and the exact components and/or processes performed may be different in various other systems implementing envelope tracking.

As illustrated, the envelope tracking system 100 includes a main RF path 101 and an envelope shaping signal generation path 102. The main RF path 101 is where an in phase (I) signal 110 and quadrature (Q) signal 115 can be used to create a composite RF signal 120 that is passed to the RF amplifiers 125.

Envelope shaping signal generation path 102 is a signal chain that can generate an envelope shaping signal. It consists of several components, including magnitude calculator 140, pre-envelope gain circuit 145, envelope shaping circuit 150, post-envelope gain/offset circuit 155, and/or DAC 160, to generate a signal appropriate to the operation of the amplifier and the prevailing signal conditions.

Envelope tracking modulator/supply 170 can modulate the voltage to the power amplifier 125 so that the amplifier is operating at its maximum efficiency point.

With respect to delay balancing, the delays through the various signal paths 101 and 102 can mean that the RF signal and the envelope shaping signal each have their own delays. These delays may need to be compensated for to synchronize the RF envelope and the envelope tracking modulator/supply.

While achieving good power conversion efficiency, there are several drawbacks for the envelope tracking PA architecture, including the following:

Wide bandwidth requirement for the envelope tracking power supply: The power supply tracking bandwidth typically needs to be two to three times wider than the signal bandwidth. As the communication system moves towards wider bandwidth channel for higher throughput, this requirement becomes very difficult if not impossible to achieve.

Mismatch between the main RF path and envelope signal path: This mismatch can be time varying. To match these two paths at all times, a background calibration algorithm with output monitoring is typically required. This adds substantial complexity to the overall PA system.

Figure 2:
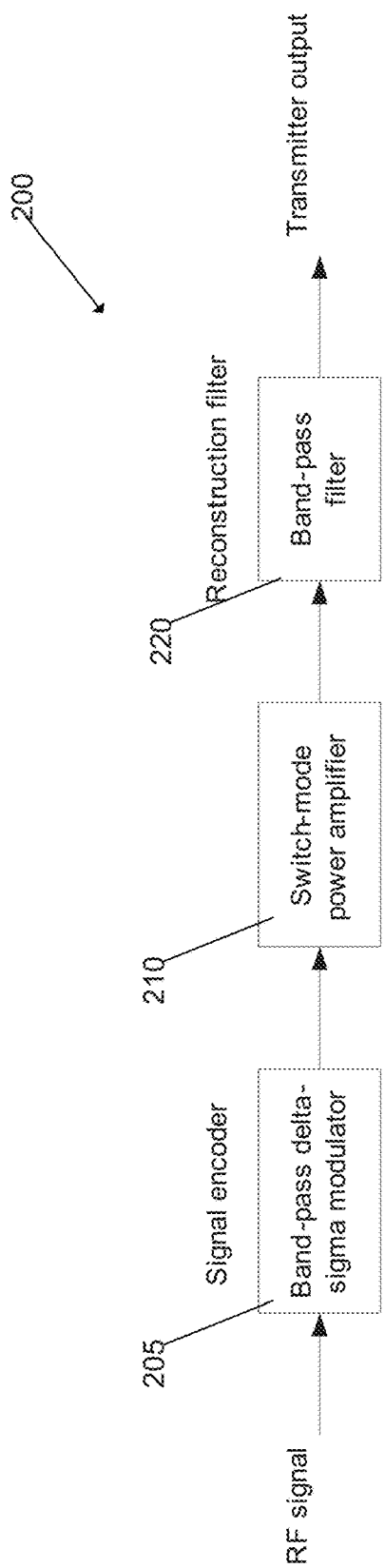
FIG. 2 illustrates an example of a switch-mode PA system.

Recently, switch-mode PA architectures (e.g., classes D, E, F, and S, among others) have emerged to be a popular choice for high power conversion efficiency PA design. A switch-mode PA may be compatible with digital signal processing and ideally 100% efficient with a tuned output load. An example of a switch-mode PA system is illustrated in FIG. 2. One skilled in the art will appreciate that the switch-mode PA system 200 may be embodied in hardware components, or a combination of hardware and firmware and/or software components. Furthermore, one skilled in the art will appreciate that the switch-mode PA system 200 is only a representation of a switch-mode PA system and the exact components and/or processes performed may be different in various other switch-mode PA systems.

As illustrated in FIG. 2, switch-mode PA system 200 includes the following three major components: 1) signal encoder which is typically implemented using a band-pass delta sigma modulator 205; 2) switch-mode power amplifier 210; and 3) reconstruction filter or band-pass filter 220. The signal encoder 205 converts the RF signal into a sequence including a very fast switching pulse train. This pulse train can be used to control the switch-mode power amplifier 210. The switch-mode power amplifier 215 may be almost always operating in the saturation region so it is very power efficient. The theoretical power conversion efficiency for an ideal switch-mode amplifier is 100%. Even though a switch-mode power amplifier may be operating in a non-linear mode, it doesn't affect the linearity of the output signal since the amplifier input is a pulse train. The linearity of the output signal is determined by the signal encoder.

Switch-mode PAs (class-D) have been very popular at audio frequencies, achieving close to its theoretically 100% conversion efficiency in real world applications. Audio frequencies are generally lower than the frequencies of RF transmissions and the typical Class-D PA switches at a few MHz. On the other hand, RF amplifiers in the microwave frequency range typically operate in the multi-GHz frequencies. As such, new classes of switch-mode PAs (e.g., classes E, F, and S, among others) have been developed to achieve faster switching speed.

Achieving multi-GHz switching frequencies can be challenging for several reasons. First, switch-mode power amplifiers generally need to switch at a frequency that is at least three times that of the output frequency band and often switch at frequencies exceeding 10 GHz. With advances of Gallium nitrate (GaN) processes, switching speed of these magnitudes have been made possible. Several companies, including Qorvo, Inc. and Northrop Grumman Corporation offer GaN power transistor switches that can switch at frequencies exceeding multiple 10s of GHz at voltages up to 65V. Furthermore, a band-pass delta sigma modulator may need to run at a switching frequency at least two times that of the output frequency.

Figure 3:
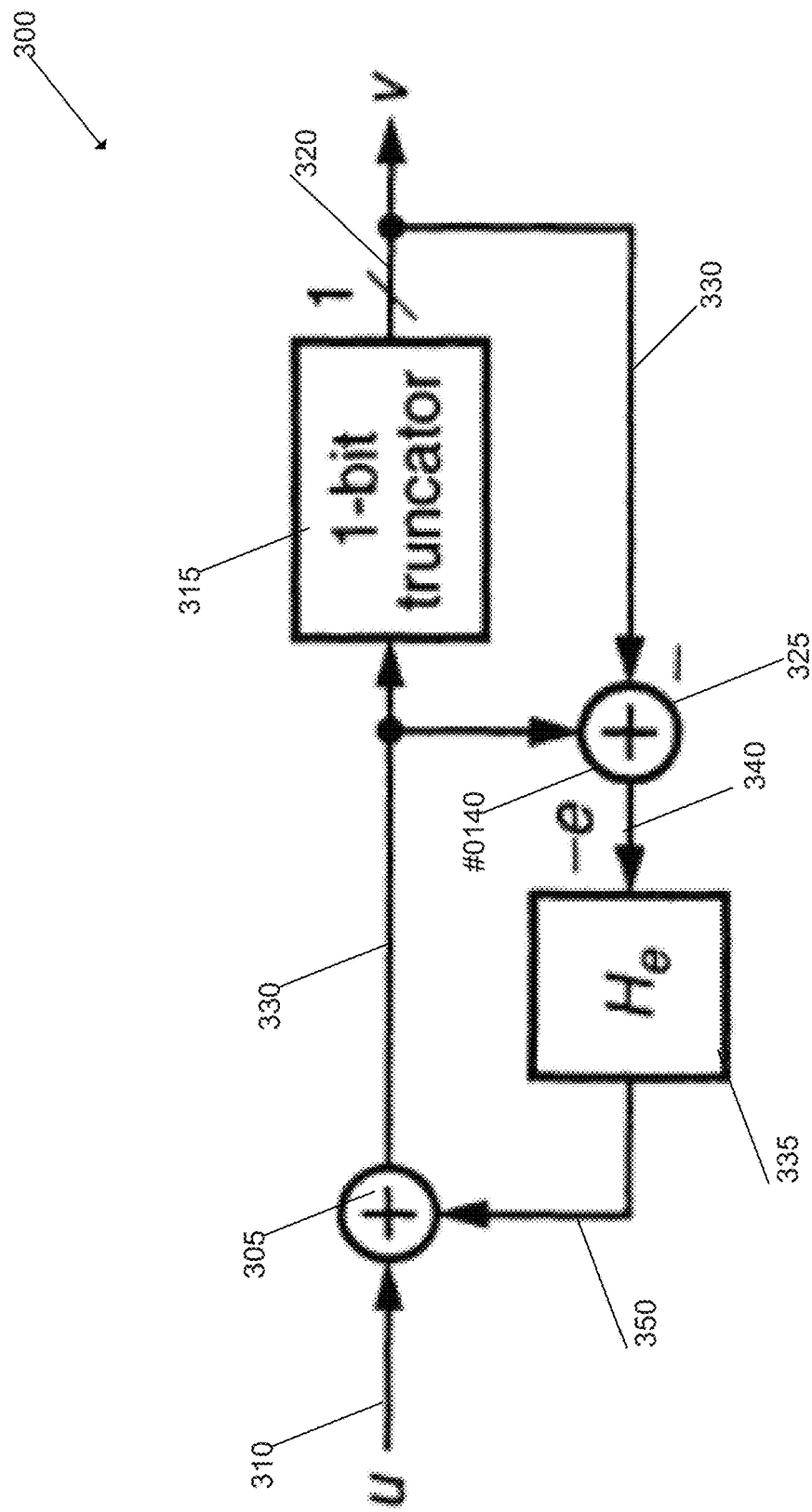
FIG. 3 illustrates an example of a delta sigma modulator implemented with an error feedback architecture.

An error feedback architecture can be a popular implementation choice for delta sigma modulation (e.g. for the purposes of performing digital to analog conversion). As discussed further below, such delta sigma modulators are not capable of switching at GHz frequencies. FIG. 3 is an example of a delta sigma modulator implemented in accordance with an error feedback architecture. As shown in FIG. 3, the quantized error can be calculated every clock cycle and can be used to calculate the next quantizer input. Thus, the speed of the delta sigma modulator is limited by the delay of the feedback path calculation. This delay typically depends on the feedback transfer function complexity and the transistor delay. The transistor delay is not expected to be improved significantly going forward. Thus, the delta sigma modulator is limited to a few hundred MHz. As noted above, however, use cases are envisaged in accordance with various embodiments of the invention in which switch-mode PA delta sigma modulators are required to switch at speeds exceeding 10 GHz. One skilled in the art will recognize that only the components of a delta sigma modulator 300 necessary for understanding the error feedback path are shown in FIG. 3. Furthermore, the components and/or processes illustrated in FIG. 3 may be implemented by hardware components, or a combination of hardware and firmware and/or software components.

As illustrated in FIG. 3, delta sigma modulator 300 includes an adder component 305 that receives a delta sigma modulator input signal 310 and a filtered error signal 350. The input signal 310 and the filtered error signal 350 are combined by the adder component 305 to output a corrected input signal 330. The corrected input signal can be received by a 1-bit truncator component 315 and an adder component 325. The 1-bit truncator component 315 generates a delta sigma modulator output signal 320 that is provided as an output and is received by adder component 325. The adder component 325 combines the corrected input signal and the output signal to generate an error signal 340. $H_e$ 335 is an error feedback transfer function. The quantizer error may be calculated and filtered by the error feedback transfer function $H_e$ 335 from the error signal to generate the filtered error signal. The filtered error signal is provided to adder component 305 to be summed with the delta sigma modulator input signal 310 for quantization.

U.S. patent application Ser. No. 15/470,805 entitled "Systems and Methods for Fast Delta Sigma Modulation Using Parallel Path Feedback Loops", filed Mar. 27, 2017 discloses interpolated filter architectures for delta sigma modulator noise shaping filters, the disclosure of which is herein incorporated by reference in its entirety. Using an interpolated filter as the noise shaping filter may allow for a parallel implementation for the delta sigma modulator at a lower clock speed. Most any arbitrary high-speed delta sigma modulator can be implemented using the parallel architectures described in accordance with many embodiments of the invention, as described in detail below. However, limiting the noise shaping filter choice to an interpolated filter can be a major constraint for delta sigma modulator designs as it may be difficult to design a noise shaping filter with both wide bandwidth and sharp rejection using the interpolated filter architectures.

Accordingly, many embodiments of the invention provide a parallel delta sigma modulator architecture implementation without an interpolated filter constraint on the noise shaping filter. Signal modulation structures for parallel implementation are described in detail below.

Parallel Delta Sigma Modulator Architectures

Existing device technology typically limits switch-mode PA switching speeds to about 10 GHz. This limits the operation frequency of the switch-mode PA to be a few GHz, whereas newer standards such as 5G are already exploring millimeter wave frequency up to 100 GHz for more bandwidth. Accordingly, many embodiments of the delta sigma modulator can be extended to include a frequency up-converter in order to allow operation in frequencies above 10 GHz. The frequency up-converted signal may be amplified by a linear PA (class-A, A/B, B, and C). Given that the post delta sigma modulator signal in accordance with many embodiments of the invention has a much lower PAPR or more favorable amplitude distribution than the source signal, the PA efficiency can be significantly improved.

In many embodiments, the parallel delta sigma modulation architecture can be applied to most all PA classes (e.g., class A, A/B, B, C, D, E, F, S, among others) that amplify orthogonal frequency—division multiplexing (OFDM) signals. Delta sigma modulation can be an effective way to reduce high PAPR resulting from OFDM modulation without degrading the error vector magnitude (EVM) of the transmitted signal. Every dB reduction in PAPR can translate to a 1 dB improvement in PA efficiency. Accordingly, implementations of parallel delta sigma modulation architectures in accordance with certain embodiments of the invention can provide about a 3 dB reduction in PAPR or 100% improvement in PA efficiency.

Parallel Delta Sigma Modulator Architectures for OFDM

Figure 4:
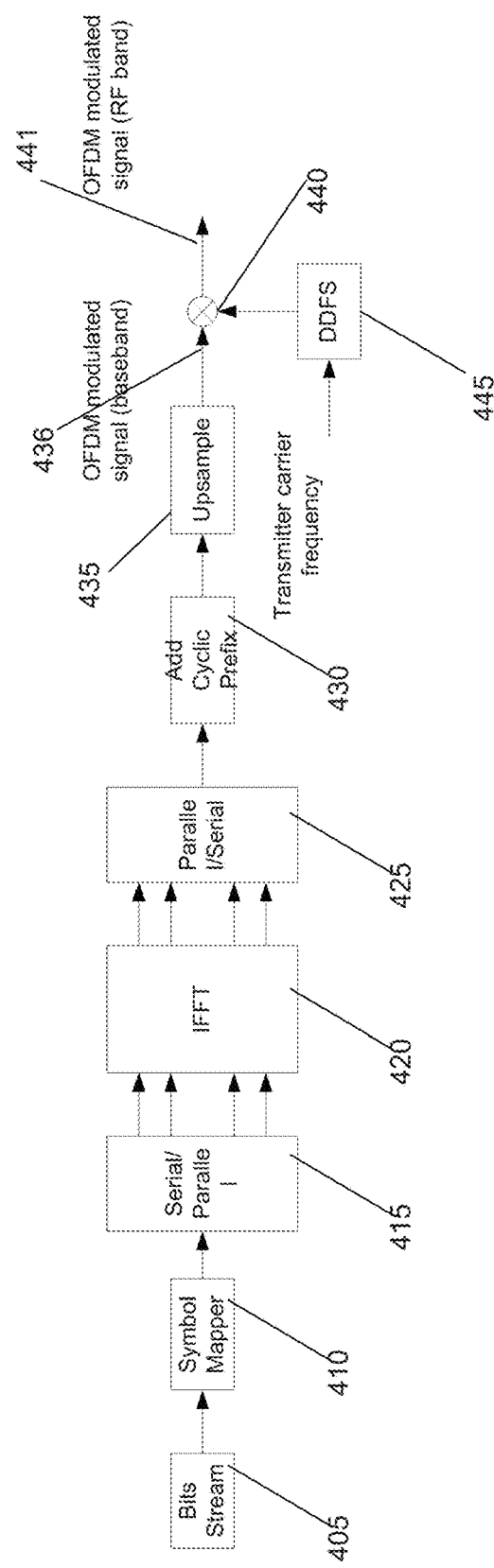
FIG. 4 illustrate an example of an OFDM modulator in accordance with an embodiment of the invention

Most modern wideband communication systems are based on OFDM and its variants. For example, a 4G LTE downlink utilizes OFDMA and the uplink is SC-FDMA. Likewise, most all high speed WiFi technologies, including standards 802.11a, 802.11n, 802.11ac among others, are based on OFDM. OFDM is also used in cable and terrestrial systems as well as many emerging communication standards. FIG. 4 illustrate an example of an OFDM modulator in accordance with an embodiment of the invention. Bits stream 405 can generate the payload bits and they can be mapped to constellation points in symbol mapper 410. A serial/parallel 415 can be used to convert serial symbol stream to vector prior to IFFT 420. A parallel/serial 425 can be used to convert IFFT output from vector form back to serial stream. Cyclic prefix can be added in add cyclic prefix 430. A up-sample block 435 may be used to up-sample digital signal to higher sample rate. The up-sample block output 436 can be in base-band and can also be known as the base-band OFDM modulated signal. The base-band OFDM modulated signal can be up-converted to RF-band with mixer 440. The carrier can be generated by DDFS 445. The mixer output 441 may be known as the RF band OFDM modulated signal and it can be converted directly to RF signal with a high-speed DAC. Although FIG. 4 illustrates a particular OFDM modulator, any of a variety of OFDM modulators may be utilized as appropriate to the requirements of specific applications in accordance with embodiments of the invention.

Figure 5:
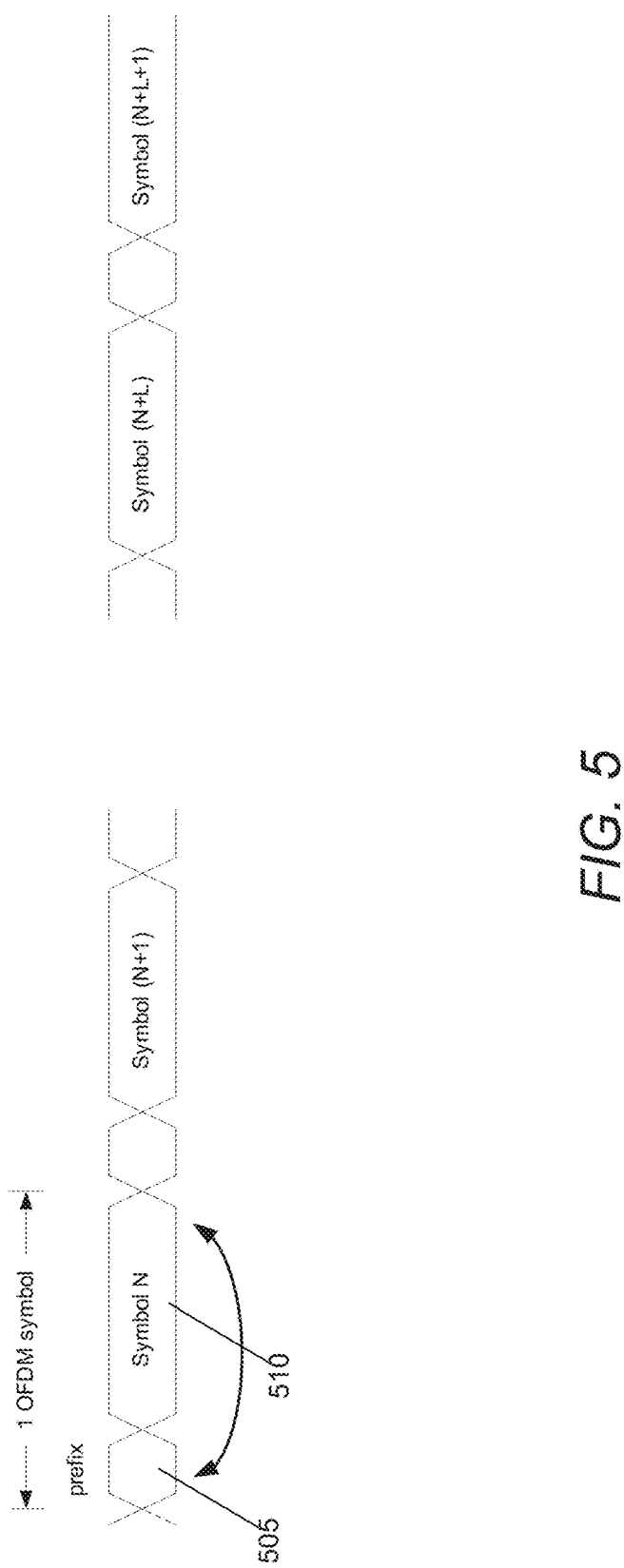
FIG. 5 illustrates an example of an OFDM signal in a time domain in accordance with an embodiment of the invention.

FIG. 5 illustrates an example of an OFDM modulated signal in the time domain. A key feature of OFDM-based systems is adding a cyclic prefix to a symbol. A cyclic prefix refers to the prefixing of a symbol with a repetition of the end. A cyclic prefix is added at the beginning of each OFDM signal. FIG. 5 illustrates a cyclic prefix 505 added to a symbol N 510, for each symbol N to symbol (N+L+1). The cyclic prefix is typically discarded by a receiver. However, the cyclic prefix may serve several purposes.

First, the cyclic prefix can serve as a guard interval, whereby it eliminates the inter-symbol interference from a previous symbol. Also, as a repetition of the end of the symbol, it can allow the linear convolution of a frequency-selective multipath channel to be modelled as circular convolution, which in turn may be transformed to the frequency domain using a discrete Fourier transform. This approach allows for simple frequency-domain processing, such as channel estimation and equalization.

Figure 6:
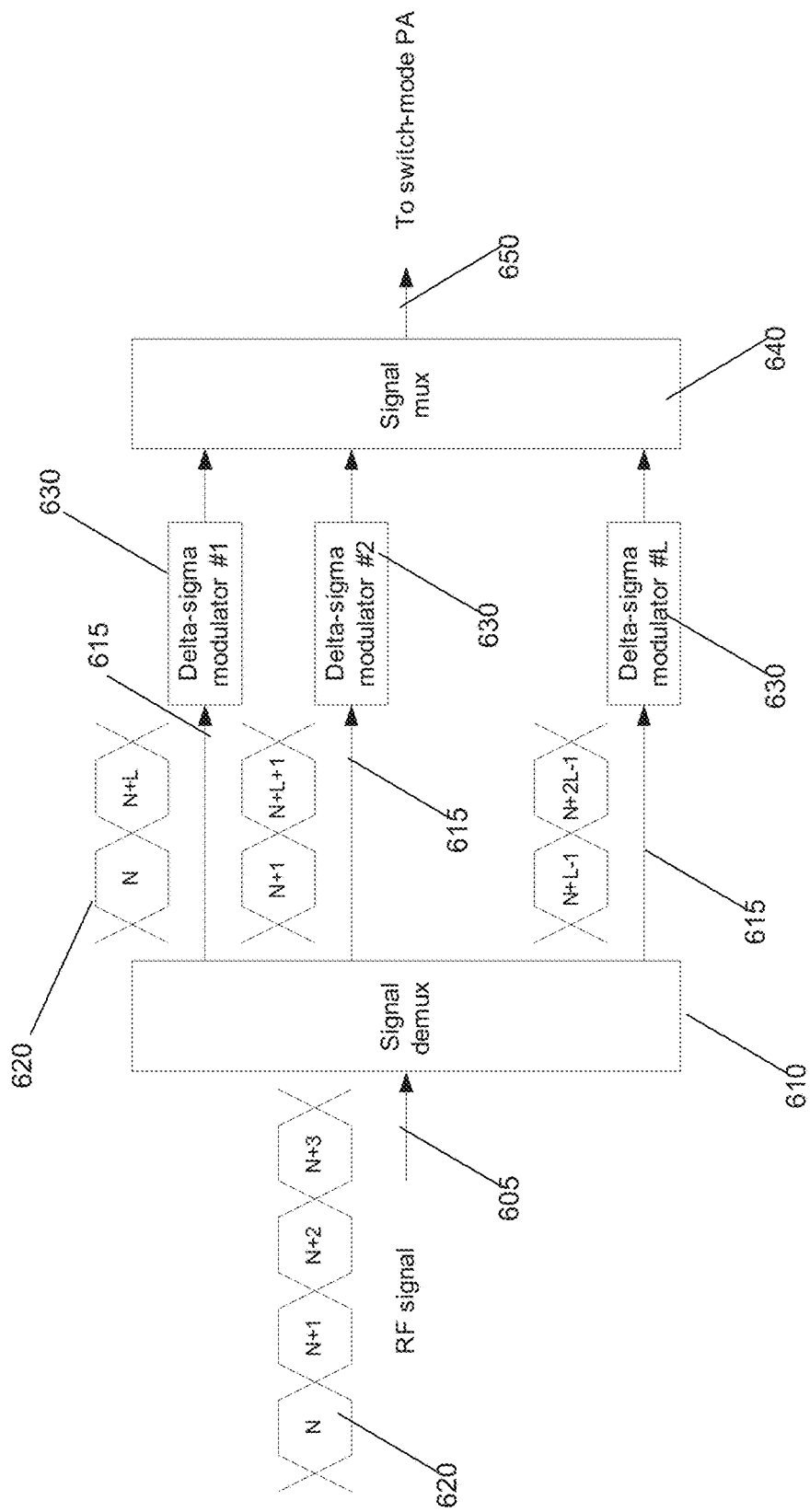
FIG. 6 illustrates a parallel delta sigma modulator architecture in accordance with an embodiment of the invention.

Power amplifiers in accordance with many embodiments of the invention incorporate a parallel delta sigma modulator architecture for improved power conversion efficiency. An example of a parallel delta sigma modulator architecture that can be employed in a power amplifier in accordance with an embodiment of the invention is illustrated in FIG. 6. As illustrated in FIG. 6, the incoming OFDM modulated signal 605 is demultiplexed using signal demultiplexer 610 into multiple streams 615 of symbols 620. Each symbol 620 includes an up-sampled IFFT output and its cyclic prefix. Each signal stream 615 is processed by a delta sigma modulator 630 running at a fraction of the full clock speed such that the delta-sigma modulator clock frequency can be an integer divider of the final pulse train output frequency. In some embodiments, the signal demultiplexer may output symbols in parallel such that the output is at the full clock speed and each delta-sigma modulator 630 (1 through L) in the 1 through L parallel delta sigma modulators may use a clock signal that is running at a clock speed of 1/L to read an input signal. In certain embodiments, each delta sigma modulator 1 through L 630 may be running at a staggered clock signal that is shifted by 1/L clock cycles relative to each other. For example, the signal demux 610 may output a symbol at a clock speed of 16 Ghz and each delta-sigma modulator may be running a clock speed of 1 Ghz with a total of 16 delta-sigma modulators running in parallel. In some embodiments, the delta-sigma modulators 630 may use the same clock signal. In certain embodiments, the delta-sigma modulators 630 may each use a different clock signal that is staggered relative to each other. The amount that each clock signal may be staggered relative to each other can be a phase shift of 1/L times the full clock speed of the signal demux 610, where L is the number of delta sigma modulators running in parallel. For example, at a full clock speed of 16 GHz for the signal demux 610, each delta sigma modulator 1 through L 630 can have a clock signal running at 1 Ghz, and each delta sigma modulator can have a phase shift of 1/L clock signals relative to each other. Thus, in this example, each delta sigma modulator would receive a new symbol at 1/16 the full clock speed of the signal demux 610.

Figure 7:
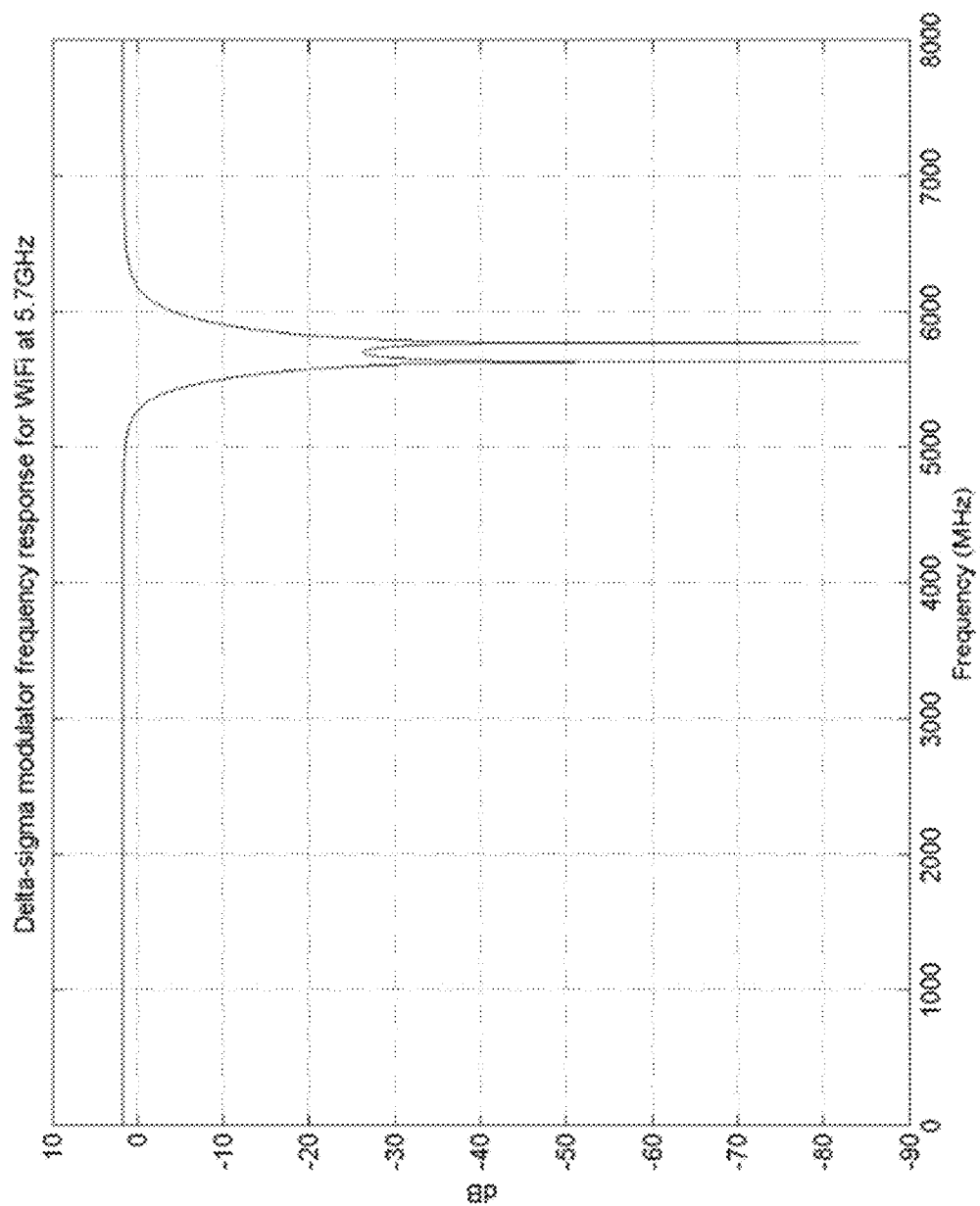
FIG. 7 illustrates an example of a noise shaping filter designed for a WiFi system at carrier frequency 5.7 GHz in accordance with an embodiment of the invention.

The outputs of these delta sigma modulators 630 are multiplexed together using signal multiplexer 640 into one pulse train 650. This pulse train 650 can be fed into the switch-mode PA for signal amplification. In the parallel implementation illustrated in FIG. 6, the noise shaping filter of each delta sigma modulator can be un-constrained. This gives a designer another degree of freedom to design a very wide bandwidth noise shaping filter or a multi-band noise shaping filter. FIG. 7 illustrates an example of a noise shaping filter designed for a WiFi system at carrier frequency 5.7 GHz.

The noise shaping filter $$H(z) = \frac{1 + 2.4754 z^{-1} + 3.5299 z^{-2} + 2.4754 z^{-3} + z^{-4}}{1 + 2.2231 z^{-1} + 2.8504 z^{-2} + 1.8179 z^{-3} + 0.6660 z^{-4}}.$$

One skilled in the art will appreciate that the parallel delta sigma modulator architecture illustrated in FIG. 6 may be embodied in embodied in hardware components, or a combination of hardware and firmware and/or software components. Furthermore, although FIG. 6 illustrates a particular parallel delta sigma modulator architecture, any of a variety of parallel delta sigma modulator architectures may be utilized as appropriate to the requirements of specific applications in accordance with embodiments of the invention.

Figure 8:
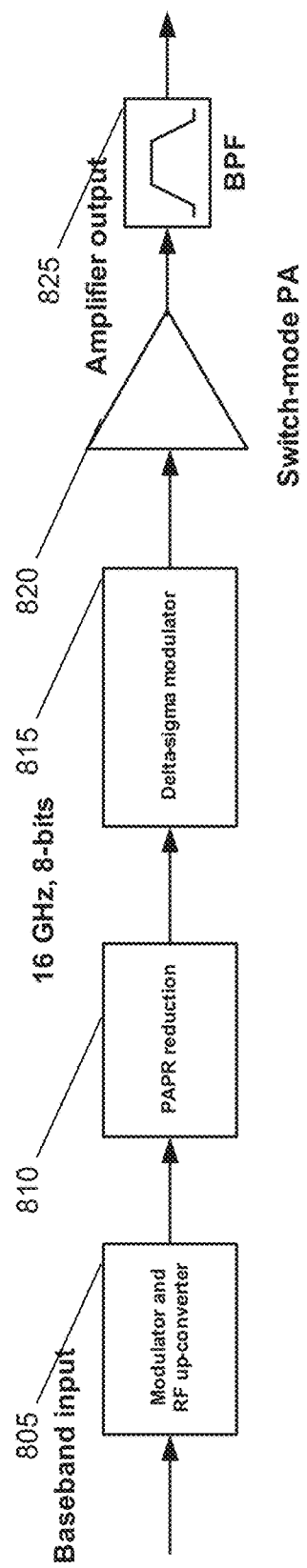
FIG. 8 illustrates a WiFi switch-mode PA design in accordance with an embodiment of the invention.

In many embodiments, the switch-mode PA design may be utilized with a variety of communication technologies, including WiFi standards 802.11a, 802.11n, 802.11ac, among others. An example of a WiFi switch-mode PA design in accordance with an embodiment of the invention is illustrated in FIG. 8. As illustrated in FIG. 8, the WiFi base-band signal is first up-converted using modulator and RF up-converter 805 to RF frequency in the digital domain. A peak to average ratio (PAPR) component 810 can be used to control the peak signal power. The digital RF signal can be encoded with a delta sigma modulator 815. The delta sigma modulator 815 outputs a three level signal (−1, 0, 1) that drives a switch-mode power amplifier 820 to output an amplifier output 825. Although FIG. 8 illustrates an example of a WiFi system, this design can be generalized to any of a variety of OFDM based systems as appropriate to the requirements of specific applications in accordance with various embodiments of the invention.

Figure 9:
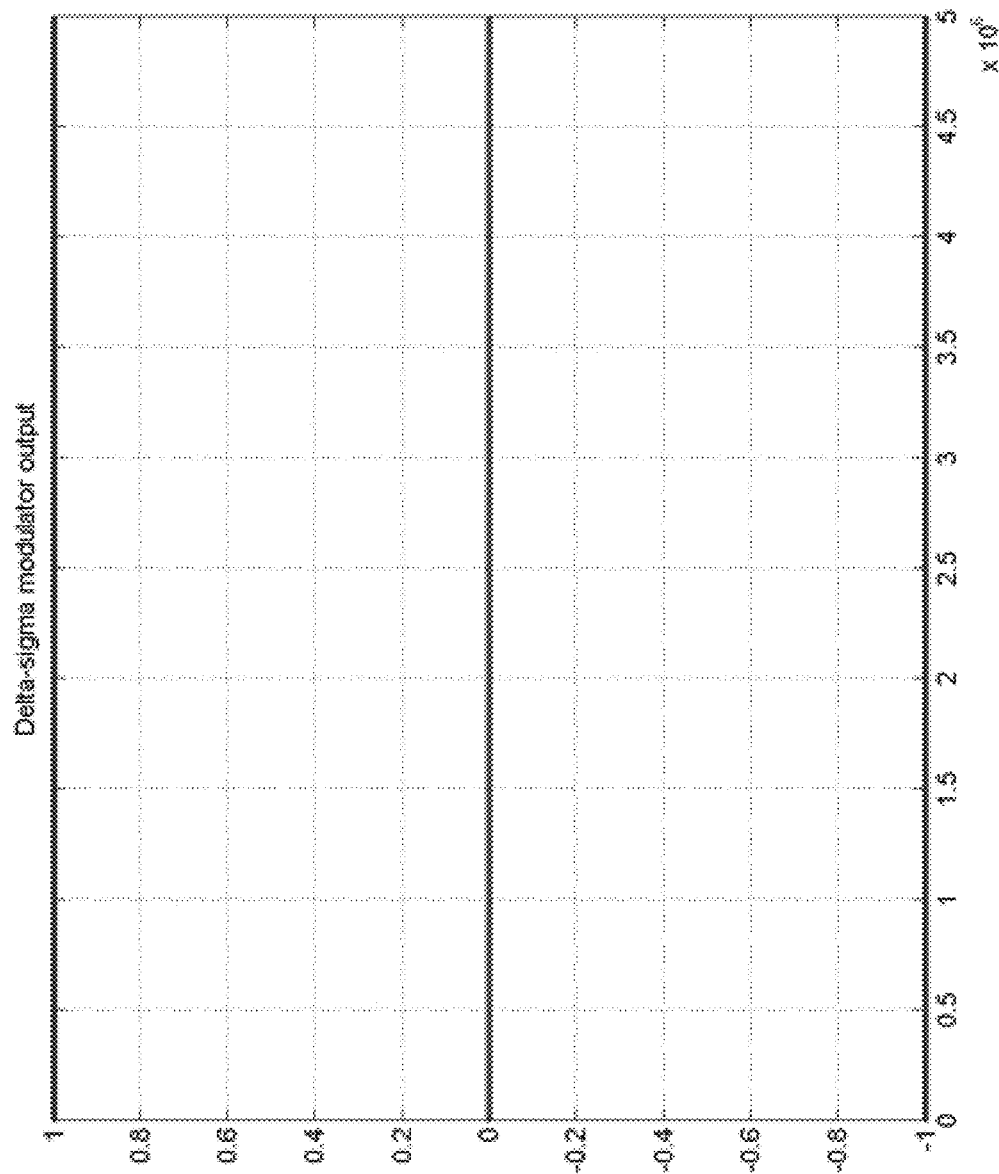
FIG. 9 illustrates an example of a delta sigma modulator output.

FIG. 9 illustrates an example of a delta sigma modulator output. As illustrated in FIG. 9, '1' means switch-mode PA outputs a positive voltage pulse and '1' means switch-mode PA outputs a negative voltage pulse. '0' means the PA is off. In many embodiments, given the PA can be either off or output a single level, no back off is needed and the power conversion efficiency is very high.

Figure 10:
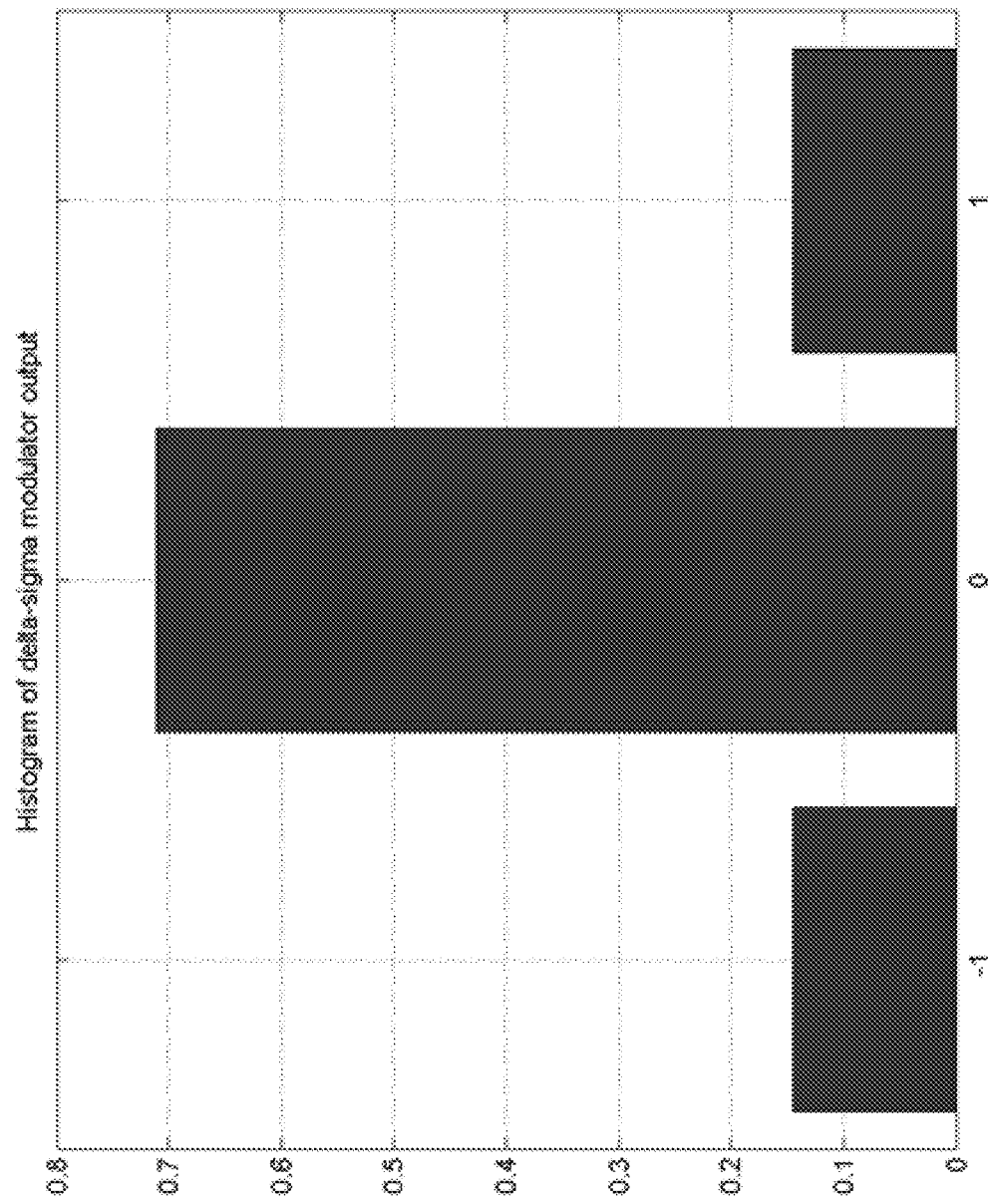
FIG. 10 illustrates a histogram of three output levels in accordance with an embodiment of the invention
Figure 11:
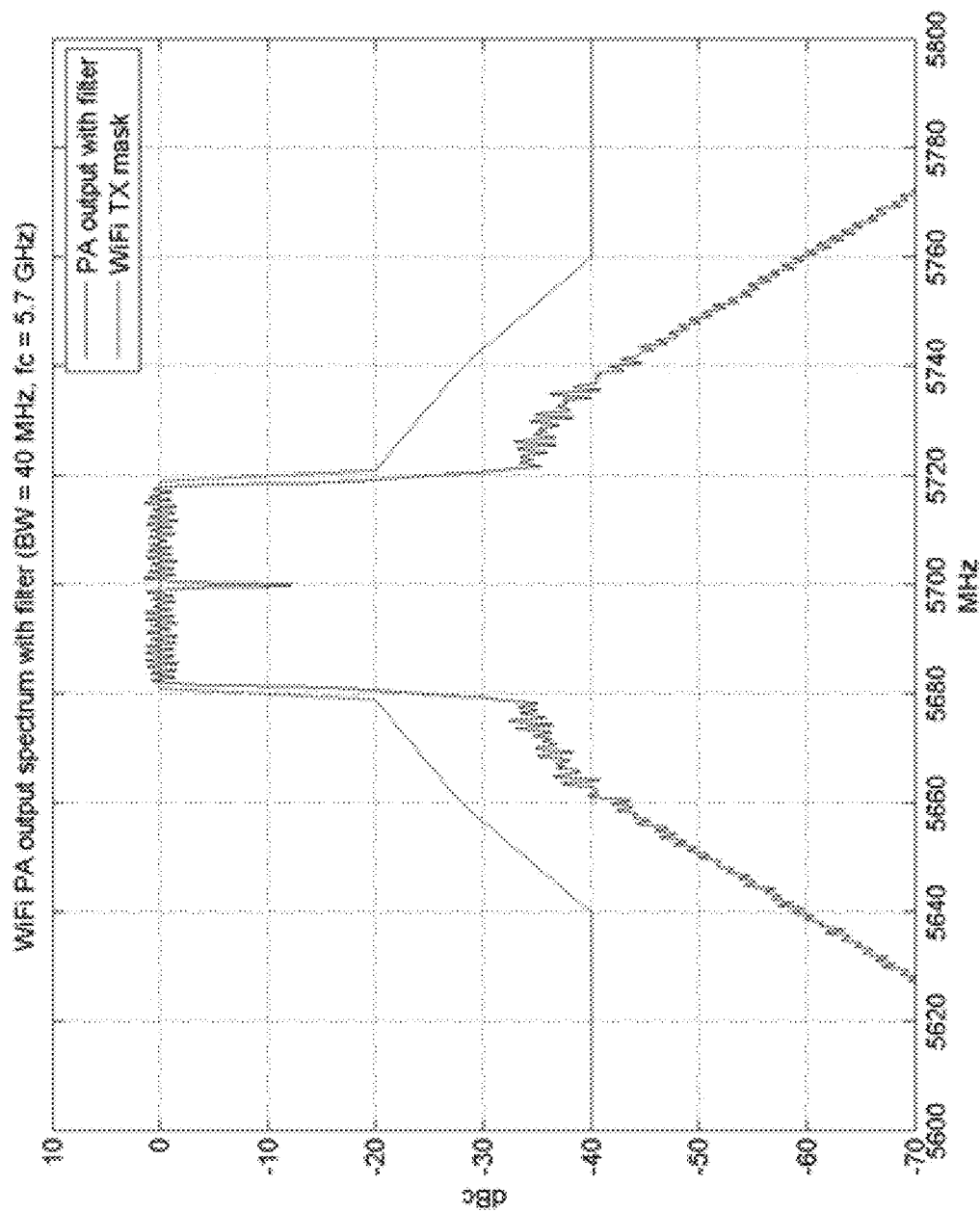
FIG. 11 illustrates an output spectrum in accordance with an embodiment of the invention.
Figure 12:
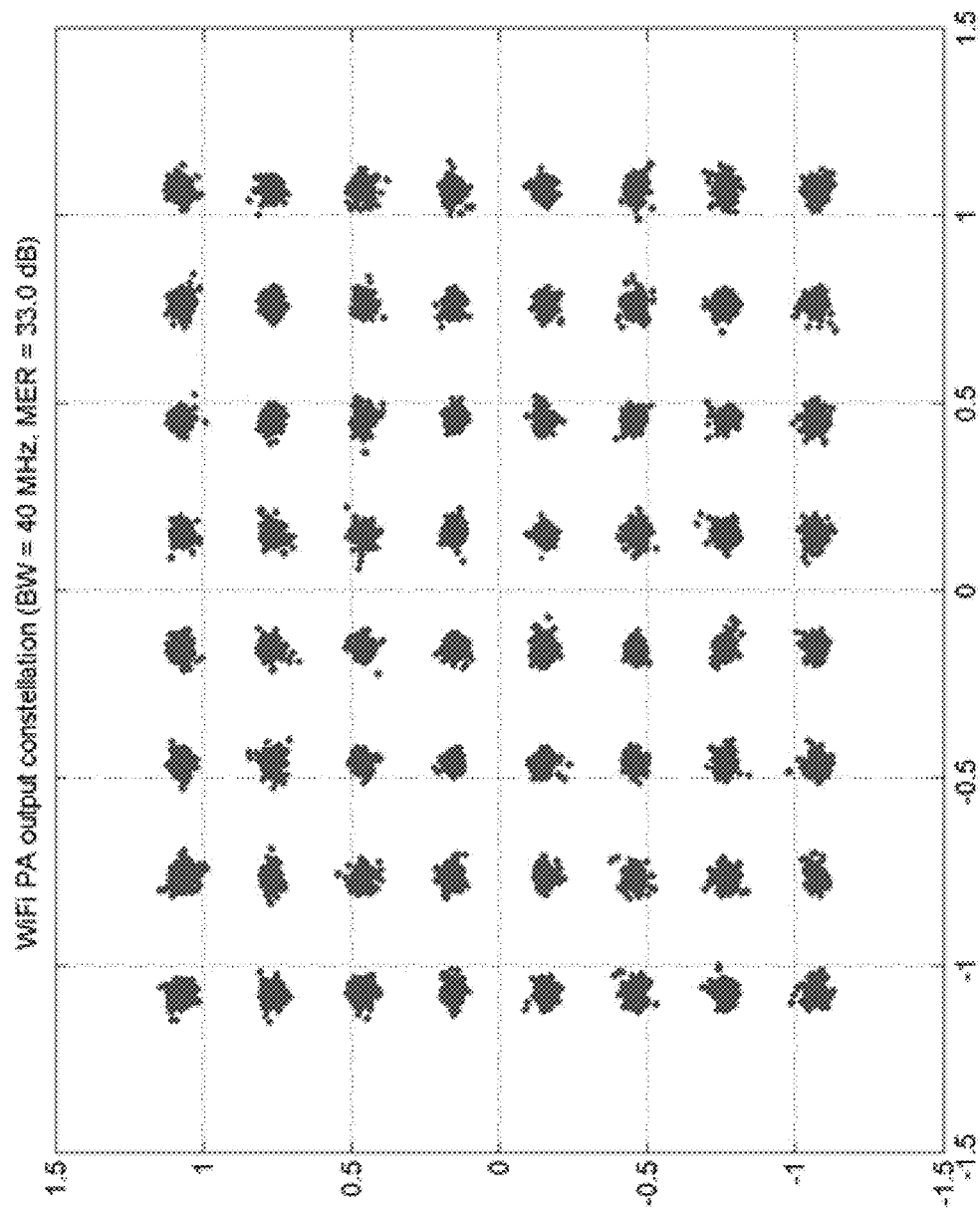
FIG. 12 illustrates a transmit signal constellation in accordance with an embodiment of the invention.

FIG. 10 illustrates a histogram of the 3 output levels in accordance with an embodiment of the invention. As shown in FIG. 10, the PA is off most of the time and dissipates no power. The '0' state (off state) reduces the DC power to the PA and improves the overall power efficiency. In many embodiments, the power encoder efficiency can be defined as the ratio of the desired signal power and the total power. In the case illustrated in FIG. 10, the power encoder efficiency after the delta sigma modulator is 56%. That is 3 times the input signal. Given the bulk of error power is out of band, a tuned PA design can be used to suppress the out-of-band energy. In theory, the power conversion efficiency of this tuned switch-mode PA can achieve 100%. The output spectrum is illustrated in FIG. 11 and the transmit signal constellation is illustrated in FIG. 12.

Figure 13:
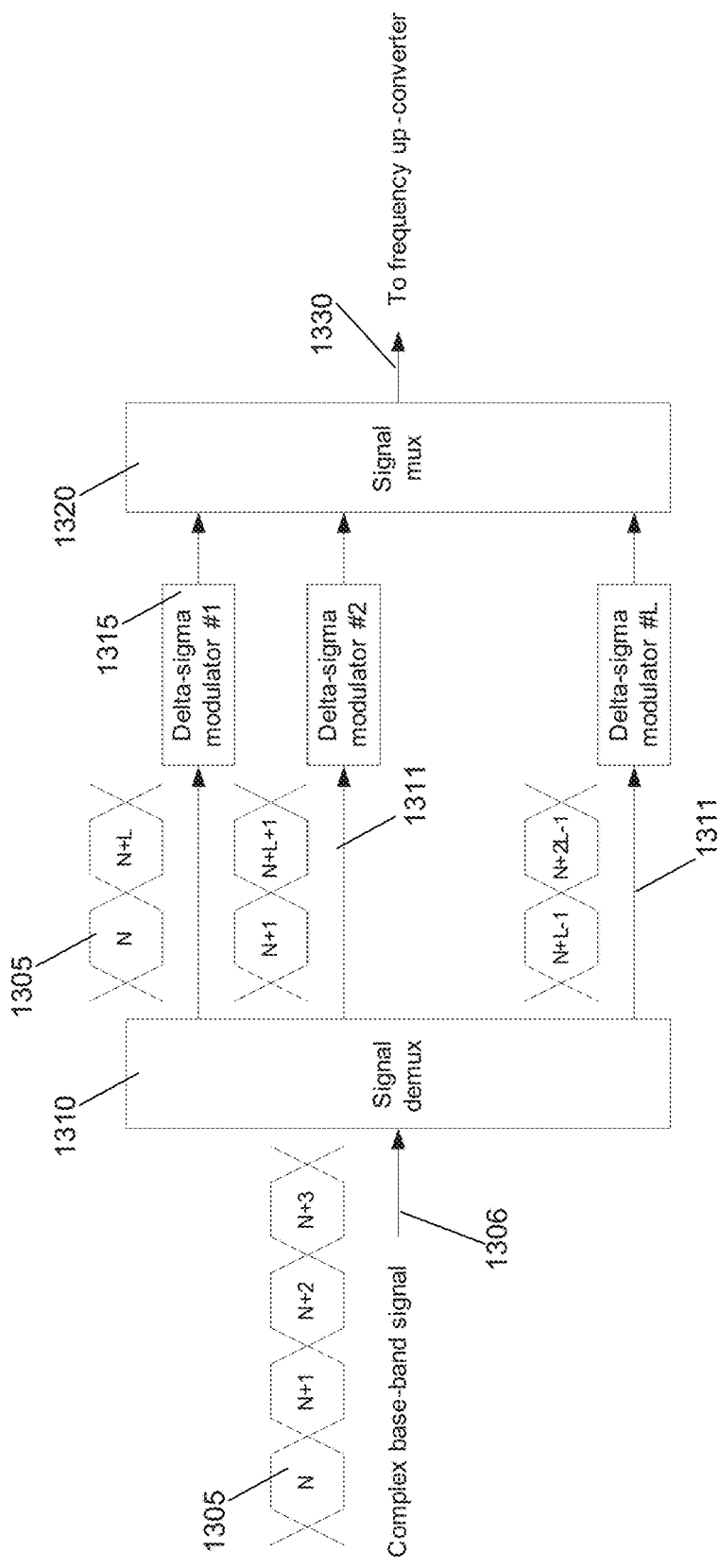
FIG. 13 illustrates a parallel delta sigma modulator with base-band signal input in accordance with an embodiment of the invention.

In many embodiments, the parallel delta sigma modulation architecture can also be applied at a base-band signal. Performing delta sigma modulation in the base-band may allow for higher frequency conversion such that the final modulated signal can be significantly higher (e.g., higher than 10 GHz). A parallel delta sigma modulator with base-band signal input in accordance with an embodiment of the invention is illustrated in FIG. 13. The incoming base-band OFDM modulated signal 1305 is demultiplexed using a signal demultiplexer 1310 into multiple streams 1311 of symbols 1305. Each signal stream 1311 is processed by a delta sigma modulator 1315 running at a fraction of the full clock speed. The outputs of these delta sigma modulators 1315 can be multiplexed together using a signal multiplexer 1320 into one pulse train 1330. This pulse train 1330 can be feed into the frequency upconverter for RF conversion. As illustrated in FIG. 13, the delta sigma modulator 1315 full clock speed should be an integer divider of the final carrier frequency. For example, if the transmitter carrier frequency is 5.7 GHz, possible choices for the delta sigma modulator 1315 full clock speed include 5.7 GHz, 2.85 GHz, 1.9 GHz, or other integer divisions of 5.7 GHz. The delta sigma modulator clock speed is chosen depends on performance requirement of the system. Although FIG. 13 illustrates a parallel delta sigma modulation architecture applied at a base-band signal, the parallel delta sigma modulation architecture may be applied to a variety of different input signals as appropriate to the requirements of specific applications in accordance with various embodiments of the invention.

Figure 14:
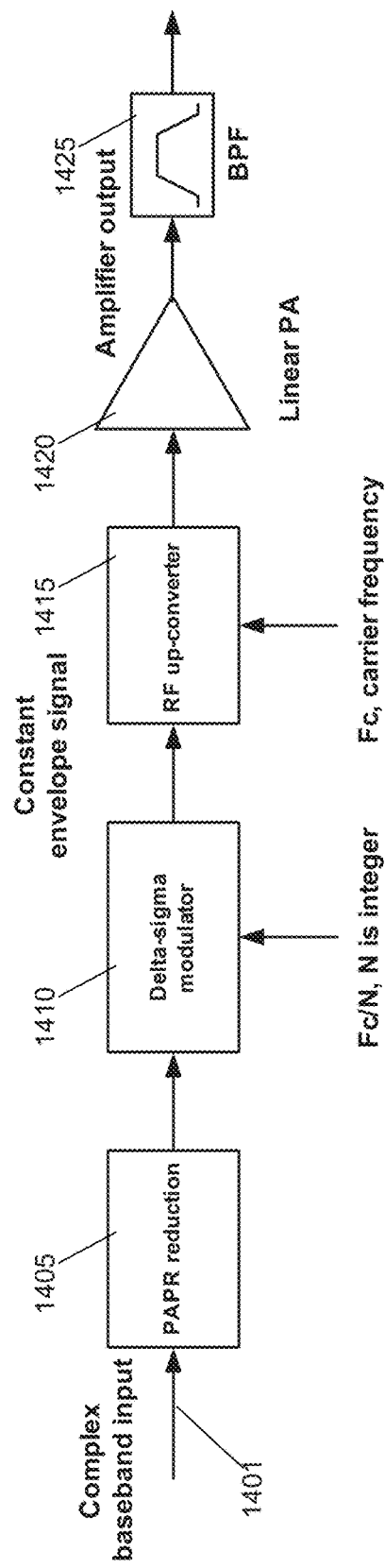
FIG. 14 illustrates a power amplifier architecture with frequency up-converter in accordance with an embodiment of the invention.

In many embodiments, the PA architecture may use a frequency up-converter to increase power conversion efficiency. An example of a PA architecture that utilizes a frequency up-converter in accordance with an embodiment of the invention is illustrated in FIG. 14. The base-band signal 1401 is processed by the PAPR reduction component 1405. It is then encoded with a delta sigma modulator 1410. The delta sigma modulator 1410 can output either 0 or a constant power signal. In this example, 6 equal spaced constellation points on a circle are chosen. Although FIG. 14 illustrates a particular PA architecture with a frequency up-converter, any of a variety of PA architectures may be utilized as appropriate to the requirements of specific applications in accordance with various embodiments of the invention.

Figure 15:
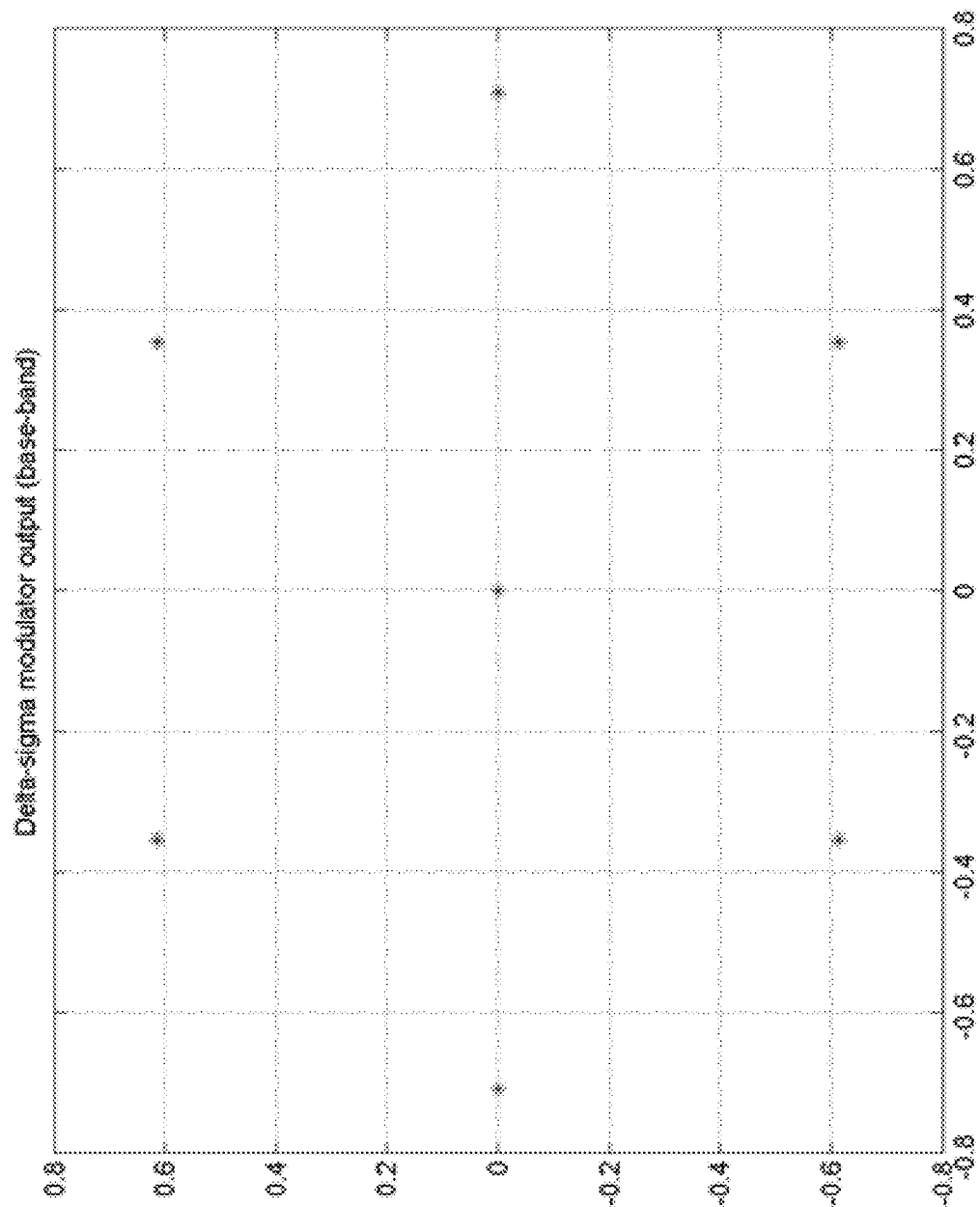
FIG. 15 illustrates an output of a delta sigma modulator in accordance with an embodiment of the invention.

An example of an output of the delta sigma modulator illustrated in FIG. 14 in accordance with an embodiment is illustrated in FIG. 15. As illustrated, '0' means the PA is off or no signal is transmitted. Non-zero means the PA is on. Given the PA is either off or has as its output a constant amplitude signal, the power conversion efficiency is very high. The '0' state (off state) reduces the DC power to the PA and improves the overall power efficiency. Given the bulk of error power is out of band, a tuned PA design can be used to suppress the out-of-band energy. Using a class-B PA as an example, the power conversion efficiency of amplifying this signal can achieve the theoretical limit of class-B or 78%.

Figure 16:
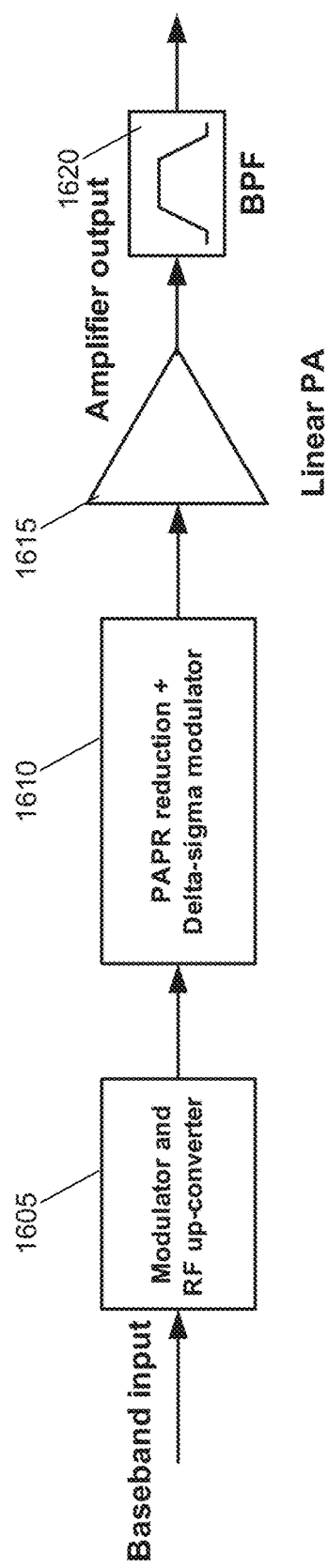
FIG. 16 illustrates an application of a parallel delta sigma modulation architecture in an RF band in accordance with an embodiment of the invention.

In many embodiments, the parallel delta sigma modulation architecture can be applied to a variety of different applications. An example of an application of the parallel delta sigma modulation architecture in the RF band in accordance with an embodiment of the invention is illustrated in FIG. 16. As illustrated in FIG. 16, the delta sigma modulator 1610 is working on the signal in the RF band with the PAPR reduction component 1610. A variety of processes can be utilized for performing PAPR reduction and most all of them generate noise. In many embodiments, delta sigma modulation can suppress the in-band noise at the expense of out-of-band noise growth. In many embodiments, by having a delta sigma modulator work together with a PAPR reduction component results in lower PAPR without SNR degradation of the desired signal. When amplifying this signal with a linear PA such as a class A PA, 1 dB reduction in PAPR can translate to a 1 dB gain in power conversion efficiency. Although FIG. 16 illustrates a particular parallel delta sigma modulation architecture in the RF band, any of a variety of parallel delta sigma modulation architectures in any of a variety of signal bands may be utilized as appropriate to the requirements of specific applications in accordance with various embodiments of the invention.

The various high efficiency power amplifier architectures described above have many advantages over existing PA designs. In particular, the parallel delta sigma modulation architectures of many embodiments makes possible very high-speed delta sigma modulation on the RF signal itself. This enables switch-mode PA designs for multi-GHz band.

Furthermore, in many embodiments there is a '0' state in the multi-level delta sigma output which turns off the PA to save power. Combined with tuned output loading, a switch-mode PA in accordance with many embodiments of the invention can approach 100% efficiency.

Likewise, a switch-mode PA in accordance with many embodiments of the invention is feed-forward and thus there is no feedback monitoring needed as in, for example, an envelope tracking PA architecture. Accordingly, the design complexity of many embodiments of the switch-mode PA can be reduced significantly.

In addition, in many embodiments, the parallel delta sigma modulation architecture can be paired with a frequency up-converter to generate higher frequency output. The delta sigma modulator in accordance with many embodiments of the invention can output either '0' or a constant amplitude signal. Having a constant amplitude signal may allow a linear PA to operate at its peak efficiency. The '0' state may allow the PA to shut off and save power. In many embodiments of the invention, using a delta sigma architecture with a tuned class-B PA, the power conversion efficiency can approach the peak efficiency of a class-B amplifier or 78%.

In many embodiments, the parallel delta sigma modulation architecture can be paired with a PAPR reduction block to get lower PAPR ratio. In many embodiments, the delta sigma modulator can suppress in-band noise at the expense of out-of-band noise growth. This may allow higher noise tolerance from the PAPR reduction and reduces the final PAPR ratio. This power conversion efficiency gain from PAPR reduction can be applied to PAs of any class appropriate to the requirements of a given application.

In many embodiments, the parallel delta sigma modulation architecture allows parallel computation of the feedback path and thus is able to achieve faster effective speed with parallelization. In several embodiments, the parallel delta sigma modulation architecture also takes advantage of the guard interval between OFDM symbols in the OFDM modulation. Multiple delta sigma processors can be used to process multiple OFDM symbols at the same time. Furthermore, in many embodiments, the delta sigma modulator may no longer be limited by the device delay of the feedback path. Accordingly, the number of computations can be the same as serial computation with no overhead for parallelization.

In many embodiments, the parallel delta sigma modulation architecture can achieve very high-speed delta sigma modulator speed with application in direct-RF conversion, switched-mode PA, and PAPR reduction, among various other applications. Although the present invention has been described in certain specific aspects, many additional modifications and variations would be apparent to those skilled in the art. It is therefore to be understood that the present invention may be practiced otherwise than specifically described, including various changes in the implementation. Thus, embodiments of the present invention should be considered in all respects as illustrative and not restrictive.

What is claimed is:

1. A parallel delta sigma modulator comprising:
   a signal demultiplexer configured to receive an input signal and to demultiplex the input signal into a plurality of streams of symbols at symbol boundaries;
   a plurality of delta sigma modulators, where each delta sigma modulator is configured to receive a stream of symbols from the plurality of streams of symbols and to generate a delta sigma modulated output; and a signal multiplexer configured to receive a plurality of delta sigma modulated outputs from the plurality of delta sigma modulators and to multiplex together the plurality of delta sigma modulated outputs into a pulse train; and a frequency up-converter configured to receive the pulse train.

2. The parallel delta sigma modulator of claim 1, wherein the input signal is an orthogonal frequency-division multiplexing (OFDM) modulated signal.

3. The parallel delta sigma modulator of claim 2, wherein: the OFDM signal comprises a plurality of symbols; and the signal demultiplexer demultiplexes the input signal using the plurality of symbols and the signal multiplexer multiplexes the plurality of delta sigma modulated outputs using the plurality of symbols.

4. The parallel delta sigma modulator of claim 1, wherein the input signal is selected from the group consisting of a complex base-band signal, an RF signal, and a WiFi base-band signal.

5. The parallel delta sigma modulator of claim 1, further comprising a switch-mode power amplifier configured to receive the pulse train for signal amplification.

6. The parallel delta sigma modulator of claim 1, wherein a clock frequency of a delta sigma modulator in the plurality of delta sigma modulators is an integer divider of the pulse train output frequency.

7. The parallel delta sigma modulator of claim 1, wherein each delta sigma modulator in the plurality of delta sigma modulators comprises a noise shaping filter that is un-constrained.

8. The delta sigma modulator of claim 1, wherein each delta sigma modulator outputs a three level signal (−1, 0, 1) that drives a switch-mode power amplifier (PA), wherein a '1' means the switch-mode PA outputs a positive voltage pulse, a '−1' means the switch-mode PA outputs a negative voltage pulse, and a '0' means the PA is off.

9. The delta sigma modulator of claim 1, wherein an output of a delta sigma modulator in the plurality of delta sigma modulators drives a linear amplifier, wherein the output is selected from the group consisting of a constant amplitude signal and a zero state signal, wherein the zero state signal turns off amplitude.

10. The delta sigma modulator of claim 1, wherein an output of a delta sigma modulator in the plurality of delta sigma modulators drives a switch-mode power amplifier (PA), wherein the output comprises a plurality of discrete signal levels.

11. The delta sigma modulator of claim 1, wherein a delta sigma modulator design is un-constrained and the equivalent oversample ratio of the delta sigma modulator is increased by N, where N equals the number of parallel delta sigma modulators.

12. A switch-mode power amplifier system comprising:
a signal encoder comprising a delta sigma modulator;
a switch-mode power amplifier;
a reconstruction filter; and
a frequency up-converter;
wherein the delta sigma modulator comprises:
a signal demultiplexer configured to receive an input signal and to demultiplex the input signal into a plurality of streams of symbols at symbol boundaries;
a plurality of delta sigma modulators, where each delta sigma modulator is configured to receive a stream of symbols from the plurality of streams of symbols and to generate a delta sigma modulated output; and
a signal multiplexer configured to receive a plurality of delta sigma modulated outputs from the plurality of delta sigma modulators and to multiplex together the plurality of delta sigma modulated outputs into a pulse train;
wherein the frequency up-converter is configured to receive the pulse train.

13. The switch-mode power amplifier of claim 12, wherein the input signal is an orthogonal frequency-division multiplexing (OFDM) modulated signal.

14. The switch-mode power amplifier of claim 13, wherein:
the OFDM signal comprises a plurality of symbols; and
the signal demultiplexer demultiplexes the input signal using the plurality of symbols and the signal multiplexer multiplexes the plurality of delta sigma modulated outputs using the plurality of symbols.

15. The switch-mode power amplifier of claim 12, wherein the input signal is selected from the group consisting of a complex base-band signal, an RF signal, and a WiFi base-band signal.

16. The switch-mode power amplifier of claim 12, wherein a clock frequency of a delta sigma modulator in the plurality of delta sigma modulators is an integer divider of the pulse train output frequency.

17. The switch-mode power amplifier of claim 12, wherein each delta sigma modulator in the plurality of delta sigma modulators comprises a noise shaping filter that is un-constrained.

18. The switch-mode power amplifier of claim 12, wherein each delta sigma modulator outputs a three level signal (−1, 0, 1) that drives the switch-mode power amplifier (PA), wherein a '1' means the switch-mode PA outputs a positive voltage pulse, a '−1' means the switch-mode PA outputs a negative voltage pulse, and a '0' means the PA is off.

19. The switch-mode power amplifier of claim 12, wherein an output of a delta sigma modulator in the plurality of delta sigma modulators drives the switch-mode power amplifier (PA), wherein the output comprises a plurality of discrete signal levels.

20. The switch-mode power amplifier of claim 12, wherein a delta sigma modulator design is un-constrained and the equivalent oversample ratio of the delta sigma modulator is increased by N, where N equals the number of parallel delta sigma modulators.

21. A linear power amplifier system comprising:
a signal encoder comprising a delta sigma modulator;
a linear power amplifier (PA);
a reconstruction filter;
wherein the delta sigma modulator comprises:
a signal demultiplexer configured to receive an input signal and to demultiplex the input signal into a plurality of streams of symbols at symbol boundaries;
a plurality of delta sigma modulators, where each delta sigma modulator is configured to receive a stream of symbols from the plurality of streams of symbols and to generate a delta sigma modulated output; and
a signal multiplexer configured to receive a plurality of delta sigma modulated outputs from the plurality of delta sigma modulators and to multiplex together the plurality of delta sigma modulated outputs into a pulse train; and
wherein an output of a delta sigma modulator in the plurality of delta sigma modulators drives the linear power amplifier (PA), wherein the output comprises a plurality of discrete signal levels;

wherein the input signal is an orthogonal frequency-division multiplexing (OFDM) modulated signal, wherein:
the OFDM signal comprises a plurality of symbols; and
the signal demultiplexer demultiplexes the input signal using the plurality of symbols and the signal multiplexer multiplexes the plurality of delta sigma modulated outputs using the plurality of symbols.

22. A parallel delta sigma modulator comprising:
a signal demultiplexer configured to receive an input signal and to demultiplex the input signal into a plurality of streams of symbols at symbol boundaries;
a plurality of delta sigma modulators, where each delta sigma modulator is configured to receive a stream of symbols from the plurality of streams of symbols and to generate a delta sigma modulated output; and
a signal multiplexer configured to receive a plurality of delta sigma modulated outputs from the plurality of delta sigma modulators and to multiplex together the plurality of delta sigma modulated outputs into a pulse train;
wherein the input signal is an orthogonal frequency-division multiplexing (OFDM) modulated signal;
wherein:
the OFDM signal comprises a plurality of symbols; and
the signal demultiplexer demultiplexes the input signal using the plurality of symbols and the signal multiplexer multiplexes the plurality of delta sigma modulated outputs using the plurality of symbols.

23. A parallel delta sigma modulator comprising:
a signal demultiplexer configured to receive an input signal and to demultiplex the input signal into a plurality of streams of symbols at symbol boundaries;
a plurality of delta sigma modulators, where each delta sigma modulator is configured to receive a stream of symbols from the plurality of streams of symbols and to generate a delta sigma modulated output; and
a signal multiplexer configured to receive a plurality of delta sigma modulated outputs from the plurality of delta sigma modulators and to multiplex together the plurality of delta sigma modulated outputs into a pulse train;
wherein each delta sigma modulator in the plurality of delta sigma modulators comprises a noise shaping filter that is un-constrained.

24. A parallel delta sigma modulator comprising:
a signal demultiplexer configured to receive an input signal and to demultiplex the input signal into a plurality of streams of symbols at symbol boundaries;
a plurality of delta sigma modulators, where each delta sigma modulator is configured to receive a stream of symbols from the plurality of streams of symbols and to generate a delta sigma modulated output; and
a signal multiplexer configured to receive a plurality of delta sigma modulated outputs from the plurality of delta sigma modulators and to multiplex together the plurality of delta sigma modulated outputs into a pulse train;
wherein each delta sigma modulator outputs a three level signal (−1, 0, 1) that drives a switch-mode power amplifier (PA), wherein a '1' means the switch-mode PA outputs a positive voltage pulse, a '−1' means the switch-mode PA outputs a negative voltage pulse, and a '0' means the PA is off.

25. A parallel delta sigma modulator comprising:
a signal demultiplexer configured to receive an input signal and to demultiplex the input signal into a plurality of streams of symbols at symbol boundaries;
a plurality of delta sigma modulators, where each delta sigma modulator is configured to receive a stream of symbols from the plurality of streams of symbols and to generate a delta sigma modulated output; and
a signal multiplexer configured to receive a plurality of delta sigma modulated outputs from the plurality of delta sigma modulators and to multiplex together the plurality of delta sigma modulated outputs into a pulse train;
wherein an output of a delta sigma modulator in the plurality of delta sigma modulators drives a linear amplifier, wherein the output is selected from the group consisting of a constant amplitude signal and a zero state signal, wherein the zero state signal turns off amplitude.

26. A parallel delta sigma modulator comprising:
a signal demultiplexer configured to receive an input signal and to demultiplex the input signal into a plurality of streams of symbols at symbol boundaries;
a plurality of delta sigma modulators, where each delta sigma modulator is configured to receive a stream of symbols from the plurality of streams of symbols and to generate a delta sigma modulated output; and
a signal multiplexer configured to receive a plurality of delta sigma modulated outputs from the plurality of delta sigma modulators and to multiplex together the plurality of delta sigma modulated outputs into a pulse train;
wherein a delta sigma modulator design is un-constrained and the equivalent oversample ratio of the delta sigma modulator is increased by N, where N equals the number of parallel delta sigma modulators.

* * * * *